US009336946B2

(12) United States Patent
Lee et al.

(10) Patent No.: US 9,336,946 B2
(45) Date of Patent: May 10, 2016

(54) MULTILAYER CERAMIC ELECTRONIC COMPONENT AND ASSEMBLY BOARD HAVING THE SAME

(71) Applicant: SAMSUNG ELECTRO-MECHANICS CO., LTD., Suwon-Si, Gyeonggi-Do (KR)

(72) Inventors: Jong Ho Lee, Suwon-Si (KR); Doo Young Kim, Suwon-Si (KR); Chang Hoon Kim, Suwon-Si (KR); Byung Soo Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 92 days.

(21) Appl. No.: 14/335,494

(22) Filed: Jul. 18, 2014

(65) Prior Publication Data

US 2015/0255213 A1    Sep. 10, 2015

(30) Foreign Application Priority Data

Mar. 7, 2014   (KR) ........................ 10-2014-0027323

(51) Int. Cl.
*H01G 4/30*    (2006.01)
*H01G 4/012*   (2006.01)
(Continued)

(52) U.S. Cl.
CPC ............... *H01G 4/012* (2013.01); *H01G 2/065* (2013.01); *H01G 4/005* (2013.01); *H01G 4/008* (2013.01); *H05K 1/0306* (2013.01); *H05K 1/162* (2013.01); *H05K 1/18* (2013.01); *H01G 4/1227* (2013.01);
(Continued)

(58) Field of Classification Search
CPC ......... H01G 4/005; H01G 4/01; H01G 4/012; H01G 4/30
See application file for complete search history.

(56) References Cited

U.S. PATENT DOCUMENTS

2006/0158827 A1*  7/2006  Lee .......................... H01G 4/30
                                                            361/311
2008/0186652 A1   8/2008  Lee et al.
(Continued)

FOREIGN PATENT DOCUMENTS

JP          61-15719 U      1/1986
JP         2000-252155 A    9/2000
(Continued)

OTHER PUBLICATIONS

Korean Notice of Office Action dated Nov. 18, 2015 issued in Korean Patent Application No. 10-2014-0027323 (English translation).

*Primary Examiner* — Dion R Ferguson
(74) *Attorney, Agent, or Firm* — McDermott Will & Emery LLP

(57) ABSTRACT

The present application describes a multilayer ceramic electronic component including a ceramic body having a thickness greater than a width and includes a dielectric layers, and has upper and lower surfaces opposing each other in a thickness direction. First and second side surfaces oppose each other in a width direction, and first and second end surfaces oppose each other in a length direction. First and second internal electrodes are stacked with at least one of the dielectric layers interposed therebetween within the ceramic body in the width direction. A volume increasing part is disposed in a lower portion of the ceramic body in the thickness direction to allow a volume of a lower margin portion of the ceramic body to be greater than that of an upper margin portion thereof.

29 Claims, 16 Drawing Sheets

(51) Int. Cl.
*H01G 4/008* (2006.01)
*H05K 1/03* (2006.01)
*H05K 1/16* (2006.01)
*H05K 1/18* (2006.01)
*H01G 2/06* (2006.01)
*H01G 4/005* (2006.01)
*H01G 4/12* (2006.01)
*H05K 3/34* (2006.01)

(52) U.S. Cl.
CPC ............... *H01G 4/30* (2013.01); *H05K 3/3442* (2013.01); *H05K 2201/10015* (2013.01)

(56) References Cited

U.S. PATENT DOCUMENTS

| | | | |
|---|---|---|---|
| 2012/0147516 A1 | 6/2012 | Kim et al. | |
| 2013/0038979 A1 | 2/2013 | Togashi | |
| 2014/0138136 A1* | 5/2014 | Ahn | H01G 2/065 174/260 |
| 2014/0144687 A1* | 5/2014 | Ahn | H01G 4/30 174/260 |
| 2014/0290998 A1* | 10/2014 | Ahn | H01G 4/30 174/260 |

FOREIGN PATENT DOCUMENTS

| | | |
|---|---|---|
| JP | 2003-282356 A | 10/2003 |
| JP | 2006-100646 A | 4/2006 |
| JP | 2008-041786 A | 2/2008 |
| JP | 2008-193055 A | 8/2008 |
| JP | 2013-038332 A | 2/2013 |
| JP | 2014-033097 A | 2/2014 |
| KR | 10-0586962 B1 | 5/2006 |
| KR | 100593930 B1 | 6/2006 |
| KR | 10-2006-0084770 A | 7/2006 |
| KR | 10-1141457 B1 | 5/2012 |

* cited by examiner

US 9,336,946 B2

MULTILAYER CERAMIC ELECTRONIC COMPONENT AND ASSEMBLY BOARD HAVING THE SAME

CROSS-REFERENCE TO RELATED APPLICATION

This application claims the benefit of Korean Patent Application No. 10-2014-0027323 filed on Mar. 7, 2014, with the Korean Intellectual Property Office, the disclosure of which is incorporated herein by reference.

TECHNICAL FIELD

The present disclosure relates to a multilayer ceramic electronic component, a manufacturing method thereof, and a board on which the multilayer ceramic electronic component is mounted.

BACKGROUND

Generally, electronic components partially formed of a ceramic material, such as a capacitor, an inductor, a piezoelectric element, a varistor, a thermistor, or the like, include a ceramic body formed of a ceramic material, internal electrodes formed within the ceramic body, and external electrodes mounted on at least one surface of the ceramic body to be connected to the internal electrodes.

Among ceramic electronic components, multilayer ceramic capacitors may include a plurality of stacked dielectric layers, internal electrodes disposed to face each other with at least one of the dielectric layers interposed therebetween, and external electrodes electrically connected to the internal electrodes.

The multilayer ceramic capacitor may be mounted on a board. The multilayer ceramic capacitor may be electrically connected to mounting pads on a circuit board through soldering, and the mounting pads may be connected to other external circuits through wiring patterns or conductive vias of the circuit board.

SUMMARY

An aspect of the present disclosure may provide a multilayer ceramic capacitor and a board for mounting the same.

According to an aspect of the present disclosure, a multilayer ceramic electronic component is provided. The component includes a ceramic body including a plurality of dielectric layers and a plurality of internal electrodes stacked in a width direction; external electrodes; and a volume increasing part disposed in a lower portion of the ceramic body in a thickness direction to allow a volume of a lower margin portion of the ceramic body to be greater than that of an upper margin portion thereof.

The volume increasing part may be formed of a dummy electrode pattern part, wherein the dummy electrode pattern part includes at least one of a dummy electrode pattern part disposed downwardly of the internal electrodes within an active part of the ceramic body in the thickness direction and a dummy electrode pattern part disposed in a lower portion of a cover part of the ceramic body in the thickness direction.

According to another aspect of the present disclosure, a multilayer ceramic electronic component is provided. The component includes a ceramic body including a plurality of dielectric layers and a plurality of internal electrodes stacked in a width direction; external electrodes; and a dummy electrode pattern part disposed in a lower portion of the ceramic body in a thickness direction to allow the center of gravity of the ceramic body to be positioned downwardly of the center of the ceramic body in the thickness direction.

According to yet another aspect of the present disclosure, an assembly board having a multilayer ceramic electronic component is provided. The board includes a printed circuit board on which first and second electrode pads are formed; and a multilayer ceramic electronic component mounted on the printed circuit board. A volume increasing part is disposed in a lower portion of a ceramic body in the multilayer ceramic electronic component allows a volume of a lower margin portion of the ceramic body to be greater than that of an upper margin portion thereof.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
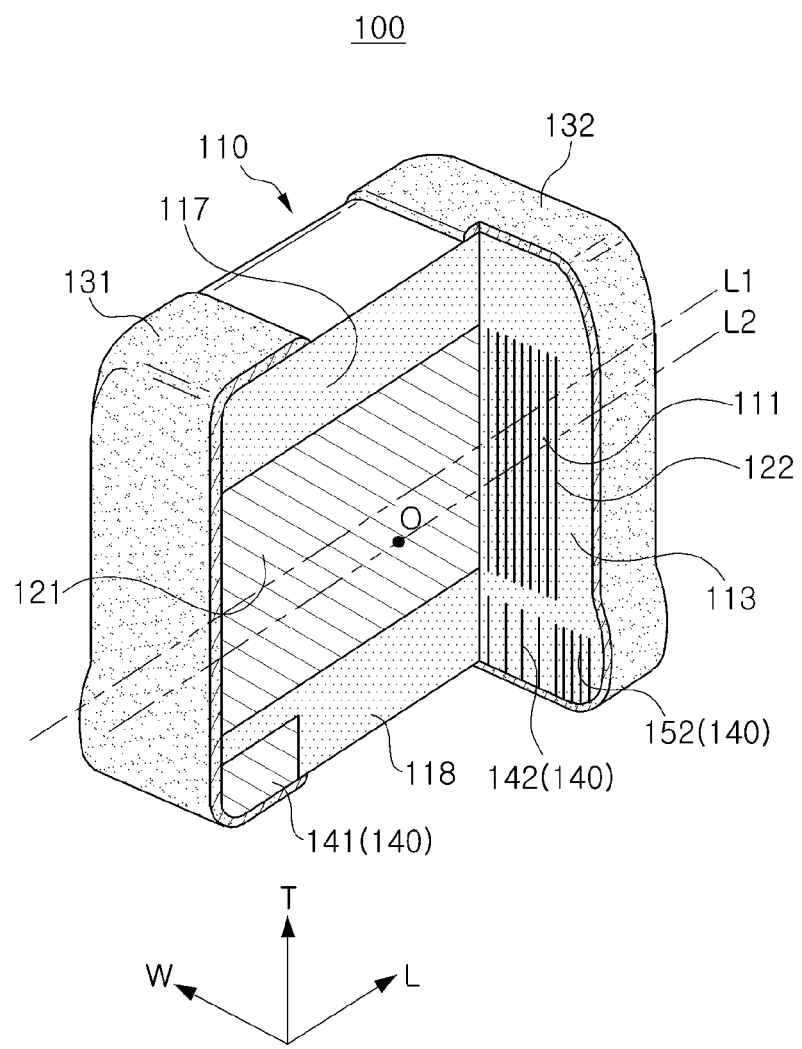
FIG. 1 is a partially cut-away perspective view schematically illustrating a multilayer ceramic electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Electronic Component

FIG. 1 is a partially cut-away perspective view schematically illustrating a multilayer ceramic electronic component according to an exemplary embodiment of the present disclosure.

Figure 2:
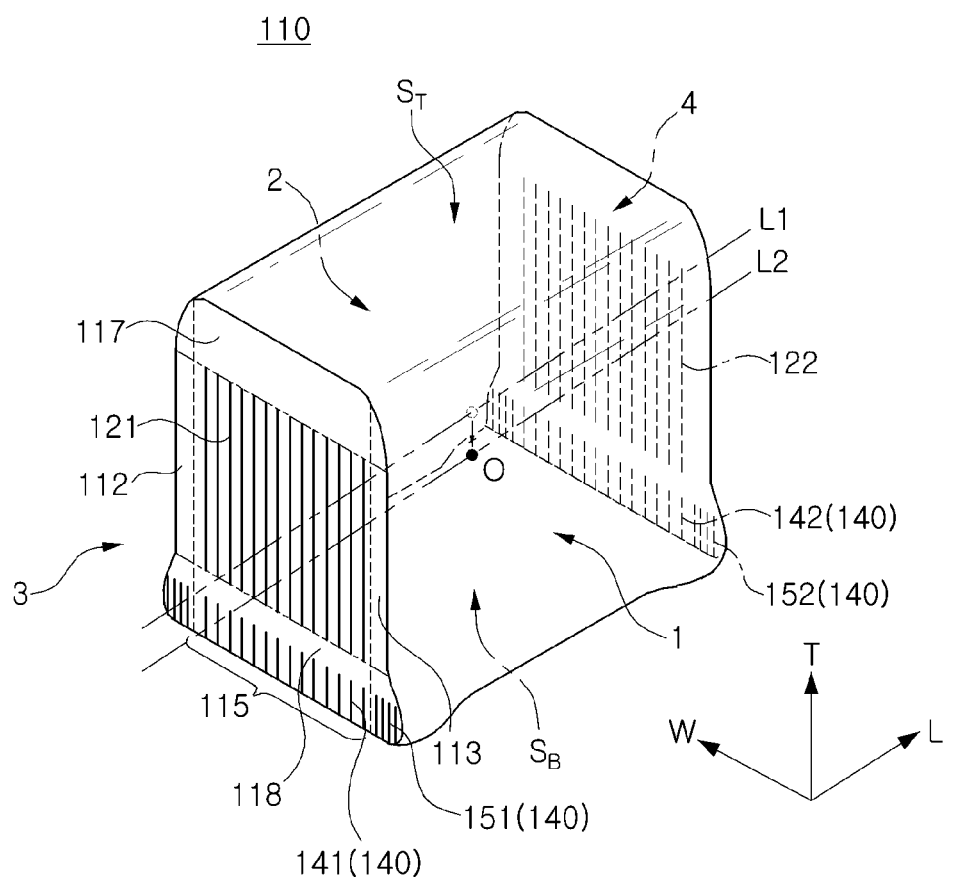
FIG. 2 is a perspective view schematically illustrating a ceramic body of the multilayer ceramic electronic component according to the exemplary embodiment of the present disclosure.

FIG. 2 is a perspective view schematically illustrating a ceramic body of the multilayer ceramic electronic component according to the exemplary embodiment of the present disclosure.

Referring to FIGS. 1 and 2, a multilayer ceramic electronic component 100 according to this exemplary embodiment of the present disclosure may include: a ceramic body 110 including a plurality of dielectric layers 111, having upper and lower surfaces $S_T$ and $S_B$ opposing each other in a thickness direction, first and second side surfaces 1 and 2 opposing each other in a width direction, and first and second end surfaces 3 and 4 opposing each other in a length direction, and having a thickness greater than a width thereof; first and second internal electrodes 121 and 122 stacked with at least one of the dielectric layers interposed therebetween within the ceramic body in the width direction; and a volume increasing part disposed in a lower portion of the ceramic body in the thickness direction to allow a lower margin portion 118 of the ceramic body to have a volume greater than that of an upper margin portion 117 thereof.

According to the exemplary embodiment of the present disclosure, the volume increasing part may be formed of a dummy electrode pattern part 140.

In the case in which the volume increasing part is formed of the dummy electrode pattern part 140, the dummy electrode pattern may be disposed on the dielectric layers and be stacked within the ceramic body in the width direction. A volume of the lower margin portion of the ceramic body may be increased by the dummy electrode pattern disposed in the lower portion of the ceramic body as compared to a case in which no dummy electrode pattern is disposed within the ceramic body.

Referring to FIGS. 1 and 2, in the case in which the dummy electrode pattern part 140 is not disposed in the upper and lower portions of the ceramic body or the dummy electrode pattern part 140 is disposed in both of the upper and lower portions of the ceramic body, the center of gravity of the ceramic body is disposed approximately on a straight line $L_1$ passing through the center of the ceramic body in the thickness direction. However, in the case in which the dummy electrode pattern part 140 is only disposed in the lower portion of the ceramic body as in the exemplary embodiment of the present disclosure, the center of gravity O of the ceramic body may be disposed on a straight line $L_2$ positioned below the center of the ceramic body in the thickness direction.

As the center of gravity O is disposed to be closer to a mounting surface of the ceramic body, a chip toppling phenomenon may be decreased at the time of mounting the ceramic body, whereby mounting stability may be secured.

According to the exemplary embodiment of the present disclosure, the dummy electrode pattern part 140 is disposed in the lower portion of the ceramic body, such that the volume of the lower margin portion 118 of the ceramic body 110 may be greater than that of the upper margin portion 117 of the ceramic body 110.

According to the exemplary embodiment of the present disclosure, the dummy electrode pattern part 140 is disposed in the lower portion of the ceramic body, such that an edge of the ceramic body at which the lower surface $S_B$ of the ceramic body 110 meets the end surface 3 or 4 of the ceramic body 110 may be longer than an edge thereof at which the upper surface $S_T$ of the ceramic body 110 meets the end surface 3 or 4 of the ceramic body 110.

In addition, an area of the lower surface $S_B$, amounting surface, of the ceramic body 110 may be larger than that of the upper surface $S_T$ of the ceramic body.

Hereinafter, a multilayer ceramic electronic component according to an exemplary embodiment of the present disclosure will be described in detail. A multilayer ceramic capacitor will be taken as being representative of a wide range of electronic components and the present disclosure is not limited thereto.

Figure 3:
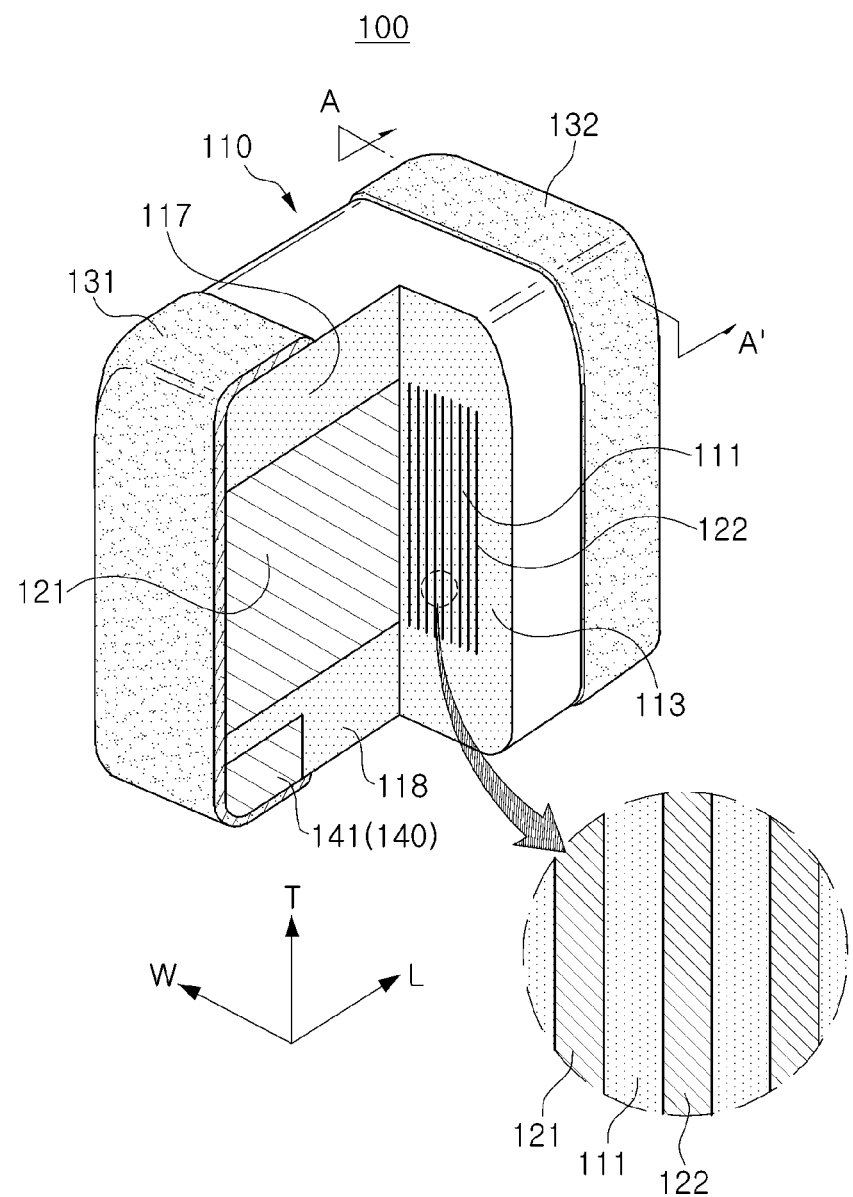
FIG. 3 is a partially cut-away perspective view schematically illustrating a multilayer ceramic electronic component according to a first exemplary embodiment of the present disclosure.
Figure 4:
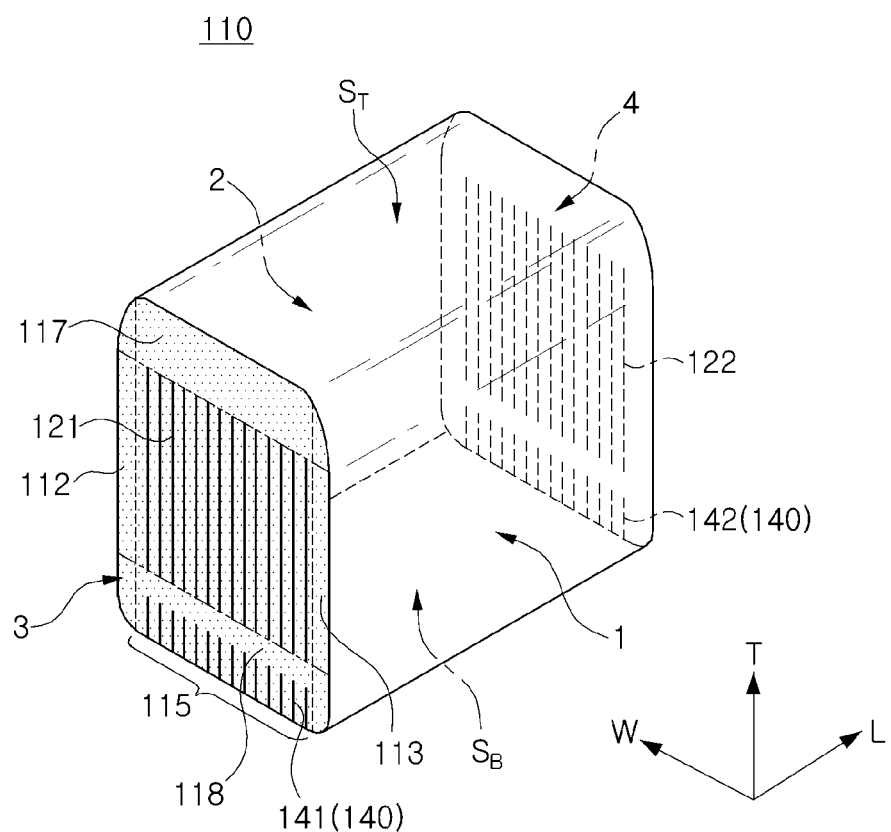
FIG. 4 is a perspective view schematically illustrating a ceramic body of the multilayer ceramic electronic component according to the first exemplary embodiment of the present disclosure.

FIG. 3 is a partially cut-away perspective view schematically illustrating a multilayer ceramic electronic component according to a first exemplary embodiment of the present disclosure, and FIG. 4 is a perspective view schematically illustrating a ceramic body of the multilayer ceramic electronic component according to the first exemplary embodiment of the present disclosure.

Referring to FIG. 3, the multilayer ceramic electronic component according to the present exemplary embodiment may include a ceramic body 110; and first and second external electrodes 131 and 132.

Referring to FIG. 4, the ceramic body 110 may have upper and lower surfaces $S_T$ and $S_B$ opposing each other in a thickness direction, first and second side surfaces 1 and 2 disposed between the upper and lower surfaces while opposing each other in a width direction, and first and second end surfaces 3 and 4 disposed between the upper and lower surfaces while opposing each other in a length direction.

A shape of the ceramic body 110 is not particularly limited, however, the ceramic body 110 may have a substantially hexahedral shape.

Although described in detail below, a width of a lower margin portion 118 of the ceramic body in the thickness direction may be wider than that of an upper margin portion 117 thereof in the thickness direction.

Further, an area of the lower surface $S_B$ of the ceramic body may be larger than that of the upper surface $S_T$ of the ceramic body.

The ceramic body 110 may be formed by stacking a plurality of dielectric layers 111. As shown in FIG. 3, the ceramic body may include internal electrodes 121 and 122 formed on the dielectric layers 111 and may be formed by stacking the plurality of dielectric layers on which the internal electrodes are formed.

The ceramic body may include a dummy electrode pattern part 140 disposed in a lower portion thereof in the thickness direction.

The internal electrodes may include first and second internal electrodes 121 and 122, wherein the first and second internal electrodes may be alternately disposed on the dielectric layers with at least one dielectric layer interposed therebetween to thereby be stacked in the width direction of the ceramic body.

The first and second internal electrodes 121 and 122 may be stacked in the width direction of the ceramic body to be alternately exposed to the first and second end surfaces 3 and 4 of the ceramic body.

In addition, the ceramic body 110 may include cover parts 112 and 113 disposed outside outermost internal electrodes in order to protect the internal electrodes from external impacts.

The ceramic body 110 may include an active part 115 and cover parts 112 and 113 stacked on both sides of the active part to be disposed in side portions of the ceramic body in the width direction. The active part may include a capacitance formation portion in which the internal electrodes and the dielectric layers are alternately stacked to thereby contribute to capacitance formation and portions of the upper and lower margin portions in which no internal electrodes are formed disposed in lower and upper side of capacitance formation portion. The active part may include dummy electrode disposed in the lower margin portion of the active part.

According to the exemplary embodiment of the present disclosure, in FIGS. 3 and 4, a W direction may be the width direction of the ceramic body 110, in which the internal electrodes 121 and 122 and the dielectric layer 111 are stacked, an L direction may be a length direction of the ceramic body 110, and a T direction may be a thickness direction of the ceramic body 110.

Here, the 'width direction' may be equal to the direction in which the dielectric layers are stacked, that is, a 'stacked direction'.

Further, the multilayer ceramic electronic component 100 may be disposed so that the thickness direction thereof is perpendicular with respect to a board at the time of being mounted on the board.

The multilayer ceramic electronic component according to this exemplary embodiment of the present disclosure may have a shape in which a thickness T of the ceramic body 110 is larger than a width W thereof in order to obtain a high degree of capacitance.

Generally, multilayer ceramic electronic components have been manufactured such that widths and thicknesses thereof are almost equal to one another.

However, the multilayer ceramic electronic component according to the exemplary embodiment of the present disclosure may have the ceramic body of which the thickness is greater than the width, and areas of overlapped portions of the internal electrodes may be increased by increasing the thickness of the ceramic body while the internal electrodes are stacked in the width direction, whereby higher amounts of capacitance may be secured even through a mounting area occupied by the electronic component according to the embodiment of the present disclosure is equal to that of the existing multilayer ceramic electronic component.

However, in the case in which the thickness of the ceramic body is greater than the width thereof, as in the exemplary embodiment of the present disclosure, a high degree of capacitance may be secured, but the center of gravity of the multilayer ceramic electronic component may rise, whereby a defect in which a chip is inclined in a taping pocket and not picked up during a pick-up process may occur, or the possibility of a chip toppling phenomenon during a mounting process may be increased.

However, according to the exemplary embodiment of the present disclosure, in the case of disposing the dummy electrode pattern part 140 capable of increasing the volume of the lower margin portion of the ceramic body in the lower portion of the ceramic body in the thickness direction, the above-mentioned problems may be solved.

The ceramic body 110 may be formed by stacking the plurality of dielectric layers 111 and the first and second internal electrodes 121 and 122 and then sintering the same. In this case, a shape of the ceramic body 110 and dimensions thereof, as well as the number of stacked dielectric layers 111 are not limited to those of the exemplary embodiment illustrated by the accompanying drawings.

For example, the number of stacked dielectric layers may be up to 100 or more.

The upper and lower margin portions 117 and 118 may be formed in the upper and lower portions of the ceramic body 110 in the thickness direction. The upper margin portion 117 of the ceramic body in the thickness direction may refer to a region positioned upwardly of upper edges of the internal electrodes 121 and 122 within the ceramic body 110, and the lower margin portion 118 of the ceramic body in the thickness direction may refer to a region disposed downwardly of lower edges of the internal electrodes 121 and 122 within the ceramic body 110. In other words, the upper margin portion 117 may refer to a region corresponding to intervals between the upper surface $S_T$ of the ceramic body and the upper edges of the internal electrodes 121 and 122, and the lower margin portion 118 may refer to a region corresponding to intervals between the lower surface $S_B$ of the ceramic body and the lower edges of the internal electrodes 121 and 122. The upper and lower margin portions may include upper and lower portions of the cover parts corresponding to those of the active part in which no internal electrodes are formed.

According to the exemplary embodiment of the present disclosure, an average thickness of the dielectric layers 111 may be optionally changed according to capacitance design of the multilayer ceramic electronic component.

In addition, the dielectric layers 111 may contain a ceramic powder having high permittivity, for example, a barium titanate ($BaTiO_3$) based powder or a strontium titanate ($SrTiO_3$) based powder, or the like, but the present disclosure is not limited thereto.

The cover parts 112 and 113 may have the same material and configuration as those of the dielectric layers 111, except that they do not include any internal electrodes. The cover parts may be formed by stacking a single layer or two or more dielectric layers on side surfaces of the active part 115 in the width direction, respectively, and generally serve to prevent the first and second internal electrodes 121 and 122 from being damaged by physical or chemical stress.

For example, the cover part may be formed by stacking ten or more dielectric layers on which the internal electrodes are not formed.

The first and second internal electrodes 121 and 122 may be formed using a conductive paste containing one or more of, for example, a noble metal material such as palladium (Pd), a palladium-silver (Pd—Ag) alloy, or the like, nickel (Ni), and copper (Cu); however, the present disclosure is not limited thereto.

Meanwhile, the first and second internal electrodes 121 and 122, a pair of electrodes having opposite polarities, may be formed by printing a conductive paste containing a conductive metal on the dielectric layers 111 at a predetermined thickness.

An average thickness of the first and second internal electrodes 121 and 122 after sintering is not particularly limited as long as target capacitance may be obtained. For example, the average thickness of the internal electrodes may be 1.5 μm or less.

According to this exemplary embodiment of the present disclosure, the first and second internal electrodes 121 and 122 may be disposed to be perpendicular with respect to the upper or lower surface $S_T$ or $S_B$ of the ceramic body. That is, the first and second internal electrodes 121 and 122 may be perpendicular to the lower surface (mounting surface) of the ceramic body, which faces the board when the multilayer ceramic electronic component is mounted on the board.

The first and second external electrodes 131 and 132 may be formed of copper (Cu), silver (Ag), nickel (Ni), or the like, but are not limited thereto.

The first and second external electrodes 131 and 132 may be formed by applying a conductive paste prepared by adding glass frit to a metal powder and then sintering the applied conductive paste.

In the present disclosure, the first and second polarities refer to different polarities.

The ceramic body 110 may include the dummy electrode pattern part 140 disposed in the lower portion thereof in the thickness direction. According to the present exemplary embodiment, the dummy electrode pattern part 140 may include first and second dummy electrode patterns 141 and 142.

The lower portion of the ceramic body 110 in the thickness direction may refer to a region below a central portion of the ceramic body in the thickness direction.

Figure 5A:
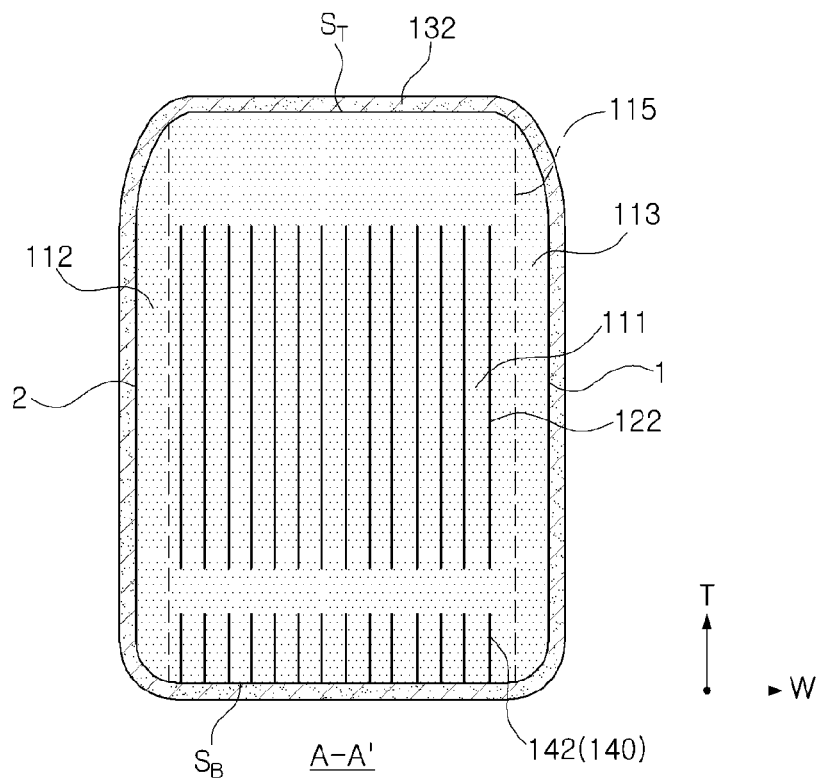
FIG. 5A is a cross-sectional view taken along line A-A' of FIG. 3.

FIG. 5A is a cross-sectional view taken along line A-A' of FIG. 3.

Figure 5B:
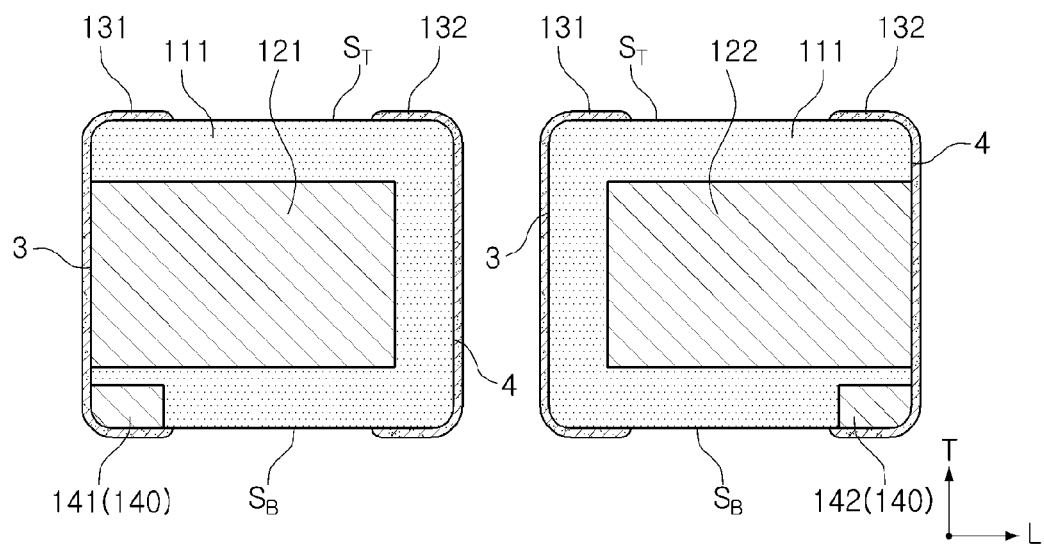
FIG. 5B is a cross-sectional view of the multilayer ceramic electronic component according to the first exemplary embodiment of the present disclosure in a length-thickness direction.

FIG. 5B is a cross-sectional view of the multilayer ceramic electronic component according to the present exemplary embodiment in a length-thickness direction, illustrating the dielectric layers 111, the internal electrodes 121 and 122 disposed on the dielectric layers, and the first and second dummy electrode patterns 141 and 142.

Referring to FIGS. 5A and 5B, the first and second dummy electrode patterns 141 and 142 may be disposed below the internal electrodes 121 and 122 disposed in the active part 115 of the ceramic body 110 in the thickness direction.

The first and second dummy electrode patterns 141 and 142 may be formed of the same material as that of the internal electrodes 121 and 122, but are not limited thereto.

According to the present exemplary embodiment, stability at the time of mounting the multilayer ceramic electronic component on the board may be secured by suppressing a width of the lower margin portion 118 of the ceramic body from shrinking during the sintering process of the ceramic body to thereby allow the volume of the low margin portion 118 of the ceramic body to be greater than that of the upper margin portion 117 of the ceramic body.

According to the exemplary embodiment of the present disclosure, the first dummy electrode pattern 141 may be disposed in a region between a central portion of the ceramic body 110 in the length direction and the first end surface 3 of the ceramic body 110 and the second dummy electrode pattern 142 may be disposed in a region between the central portion of the ceramic body 110 in the length direction and the second end surface 4 of the ceramic body 110.

As shown in FIGS. 5A and 5B, the first dummy electrode pattern 141 may be disposed on the dielectric layer 111 on which the first internal electrode 121 is formed, and the second dummy electrode pattern 142 may be disposed on the dielectric layer 111 on which the second internal electrode 122 is formed.

The first and second dummy electrode patterns 141 and 142 may be alternately formed on the dielectric layers 111 in different positions.

For example, the first and second dummy electrode patterns 141 and 142 may be alternately disposed with one dielectric layer 111 interposed therebetween.

As described above, in the case in which the first dummy electrode pattern 141 is disposed on the dielectric layer 111 on which the first internal electrode 121 is formed, and the second dummy electrode pattern 142 is disposed on the dielectric layer 111 on which the second internal electrode 122 is formed, the number of first dummy electrode patterns 141 may be equal to the number of first internal electrodes 121, and the number of second dummy electrode patterns 142 may be equal to the number of second internal electrodes 122.

According to the present exemplary embodiment, the first and second dummy electrode patterns 141 and 142 may be spaced apart from the first and second internal electrodes 121 and 122.

End portions of the first and second dummy electrode patterns 141 and 142 may be exposed to the lower surface $S_B$ of the ceramic body. In the case in which the end portions of the first and second dummy electrode patterns 141 and 142 are exposed to the lower surface $S_B$ of the ceramic body, the first and second external electrodes 131 and 132 may be extended to the lower surface $S_B$ of the ceramic body to cover the exposed portions of the first and second dummy electrode patterns, respectively.

The first and second external electrodes 131 and 132 may also be extended to the upper surface $S_T$ of the ceramic body at a length substantially similar to that of portions of the first and second external electrodes 131 and 132 extended to the lower surface $S_B$ of the ceramic body.

According to the exemplary embodiment of the present disclosure, the end portion of the first dummy electrode pattern 141 may be exposed to the first end surface 3 of the ceramic body, and the end portion of the second dummy electrode pattern 142 may be exposed to the second end surface 4 of the ceramic body.

In the case in which the first and second dummy electrode patterns 141 and 142 are led out to the end surfaces 3 and 4 or the lower surface $S_B$ of the ceramic body, the first and second dummy electrode patterns 141 and 142 may be connected to the first and second external electrodes 131 and 132, respectively, whereby adhesive strength of the external electrodes may be improved.

FIGS. 6A, 7A, 8A, and 9A are cross-sectional views of the multilayer ceramic electronic component according to the first exemplary embodiment of the present disclosure in a width-thickness direction, illustrating modified examples of the first and second dummy electrode patterns disposed in the active part. FIGS. 6B, 7B, 8B, and 9B are cross-sectional views of the multilayer ceramic electronic component according to the first exemplary embodiment of the present disclosure in a length-thickness direction, illustrating modified examples of the first and second dummy electrode patterns disposed in the active part.

FIGS. 6A, 7A, 8A, and 9A may correspond to FIGS. 6B, 7B, 8B, and 9B, respectively.

Figure 6A:
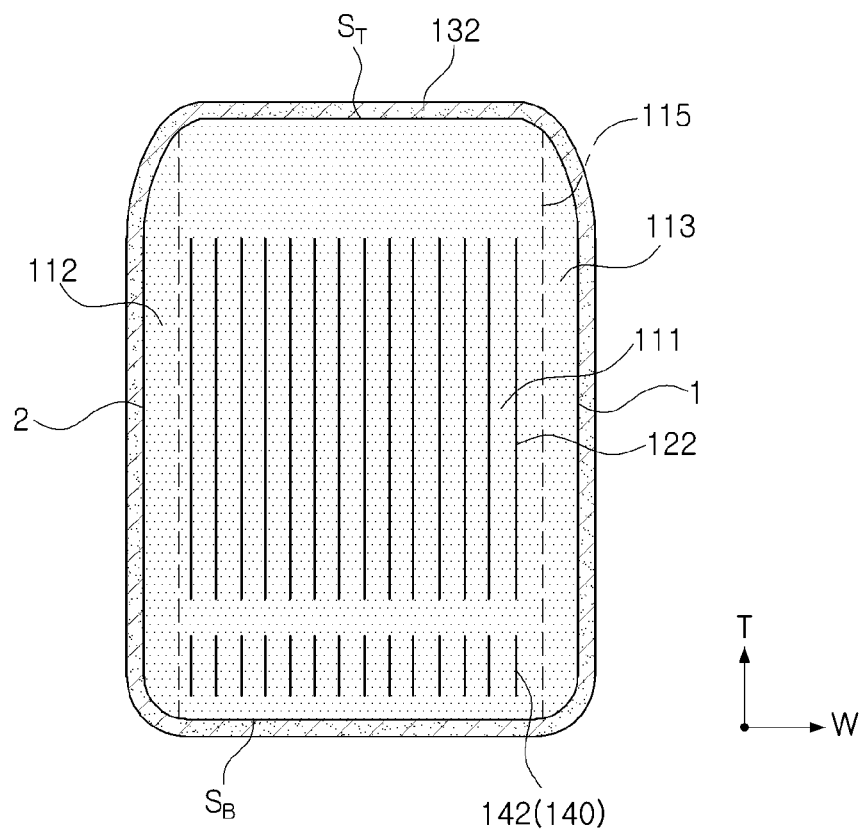
FIGS. 6A, 7A, 8A, and 9A are cross-sectional views of the multilayer ceramic electronic component according to the first exemplary embodiment of the present disclosure in a width-thickness direction, illustrating modified examples of dummy electrode patterns disposed in an active part.
Figure 6B:
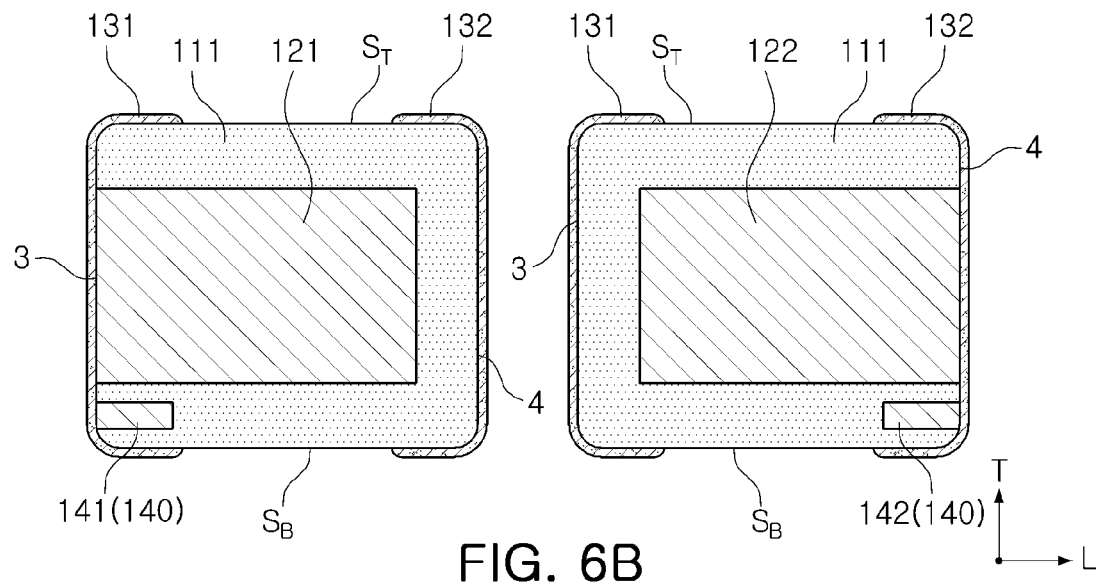
FIGS. 6B, 7B, 8B, and 9B are cross-sectional views of the multilayer ceramic electronic component according to the first exemplary embodiment of the present disclosure in the length-thickness direction, illustrating modified examples of dummy electrode patterns disposed in the active part.

Referring to FIGS. 6A and 6B, the first and second dummy electrode patterns 141 and 142 may not be led out to the lower surface of the ceramic body. In the case in which the first and second dummy electrode patterns 141 and 142 are not led out to the lower surface of the ceramic body as in the present modified example, lengths of the first and second dummy electrode patterns 141 and 142 may be determined regardless of the lengths of the portions of the external electrodes extended to the lower surface of the ceramic body.

Figure 7A:
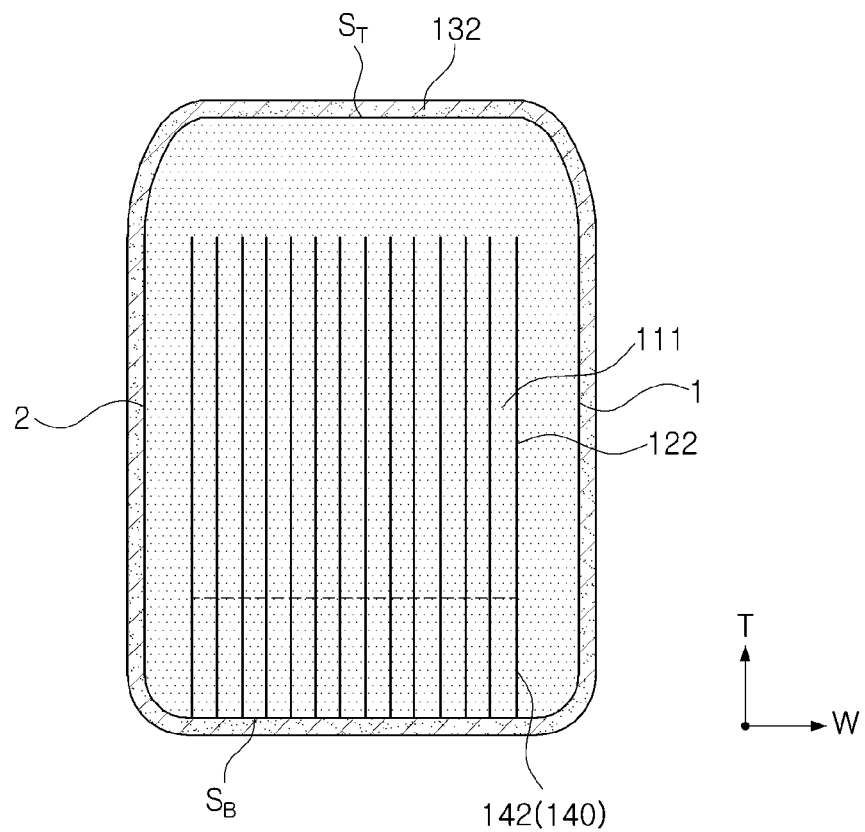
Figure 7B:
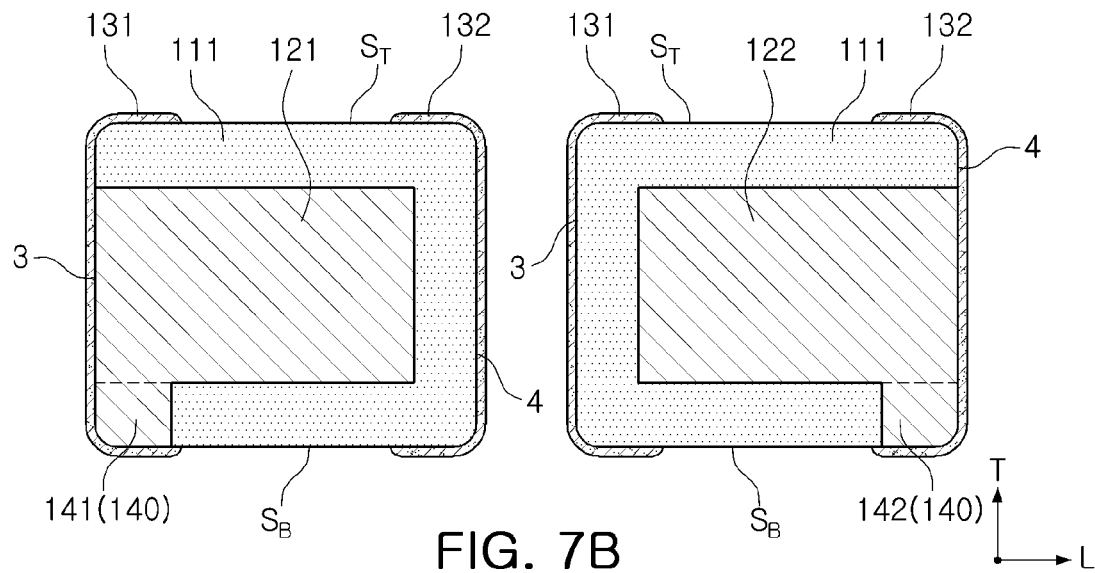

Referring to FIGS. 7A and 7B, at least one of the first and second dummy electrode patterns 141 and 142 may be connected to the corresponding internal electrodes. For example, the first dummy electrode pattern 141 may be disposed to be connected to the first internal electrode 121, and the second dummy electrode pattern 142 may be disposed to be connected to the second internal electrode 122.

Figure 8A:
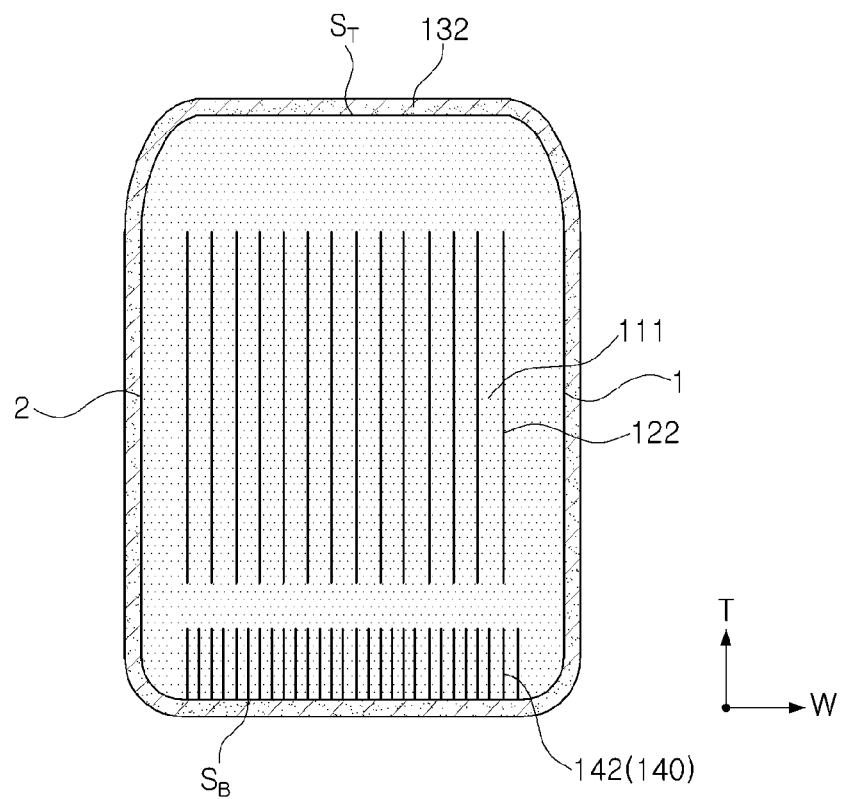
Figure 8B:
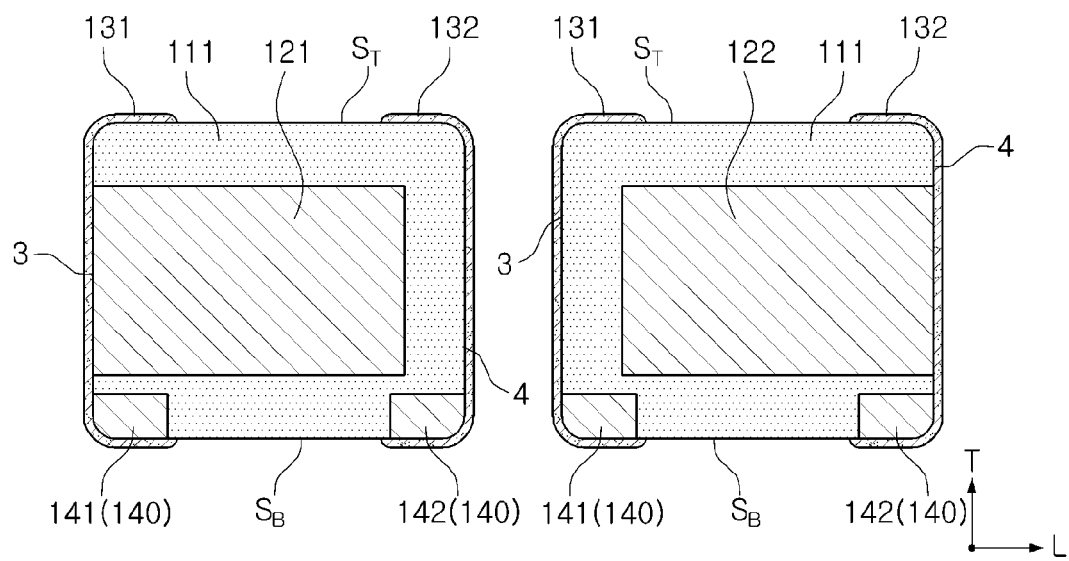

Further, as shown in FIGS. 8A and 8B, the first dummy electrode pattern 141 may be formed on the dielectric layer 111 on which the first internal electrode 121 is disposed and the dielectric layer 111 on which the second internal electrode 122 is disposed, and the second dummy electrode pattern 142 may be formed on the dielectric layer 111 on which the first internal electrode 121 is disposed and the dielectric layer 111 on which the second internal electrode 122 is disposed. That is, both the first and second dummy electrode patterns 141 and 142 may be disposed on the same dielectric layer 111.

In the case in which the first dummy electrode pattern 141 is formed on the dielectric layer 111 on which the first internal electrode 121 is disposed and the dielectric layer 111 on which the second internal electrode 122 is disposed; and the second dummy electrode pattern 142 is equally formed on the dielectric layer 111 on which the first internal electrode 121 is disposed and the dielectric layer 111 on which the second internal electrode 122 is disposed, the number of first dummy electrode patterns 141 may be equal to the sum of the number of first internal electrodes 121 and the number of second internal electrodes 122, and the number of second dummy electrode patterns 142 may be equal to the sum of the number of first internal electrodes 121 and the number of second internal electrodes 122.

That is, the first and second dummy electrode patterns 141 and 142 may be formed on the dielectric layer on which the first internal electrode 121 is disposed, and the first and second dummy electrode patterns 141 and 142 may be formed on the dielectric layer on which the second internal electrode 122 is disposed.

In the case in which each of the number of first dummy electrode patterns 141 and the number of second dummy electrode patterns 142 is equal to the sum of the number of first internal electrodes 121 and the number of second internal electrodes 122 as in the modified example, a width of a region of the lower margin portion of the ceramic body in which the dummy electrode patterns are disposed may be similar to a width of the central portion of the ceramic body in the thickness-length direction.

In the case in which the first and second dummy electrode patterns 141 and 142 are disposed on the same dielectric layer as in this modified example, the first and second dummy electrode patterns 141 and 142 need to be spaced apart from each other in order to prevent short-circuits. For example, the first and second dummy electrode patterns may be disposed on the same dielectric layers to be spaced apart from each other in the length direction, and may be stacked in the width direction.

Both of the first and second dummy electrode patterns 141 and 142 may be disposed to be spaced apart from the first and second internal electrodes 121 and 122.

Figure 9A:
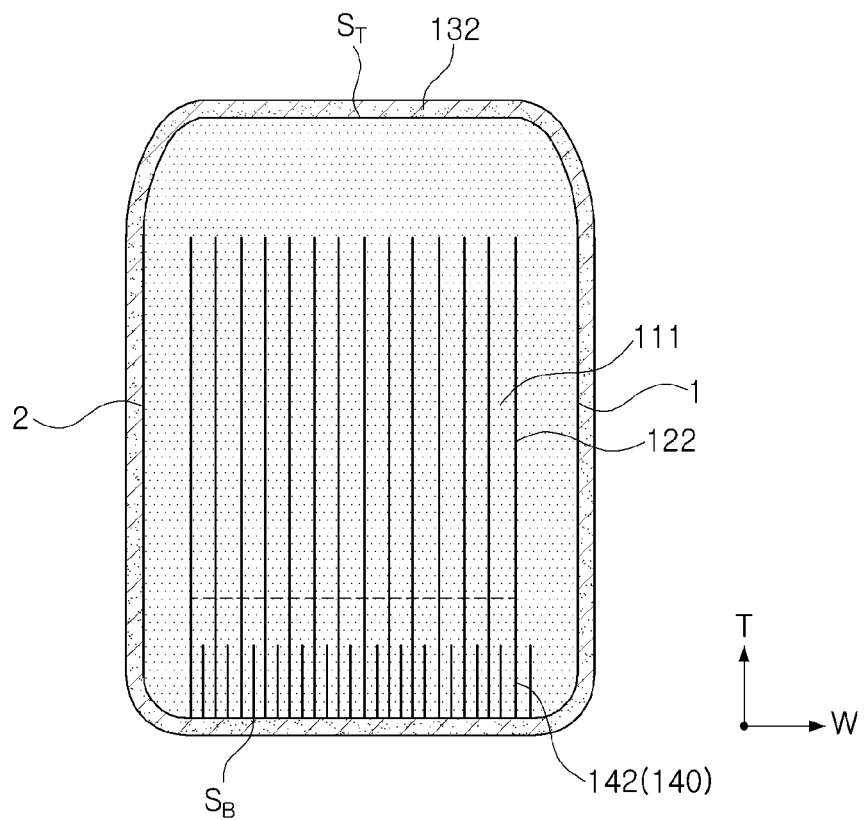
Figure 9B:
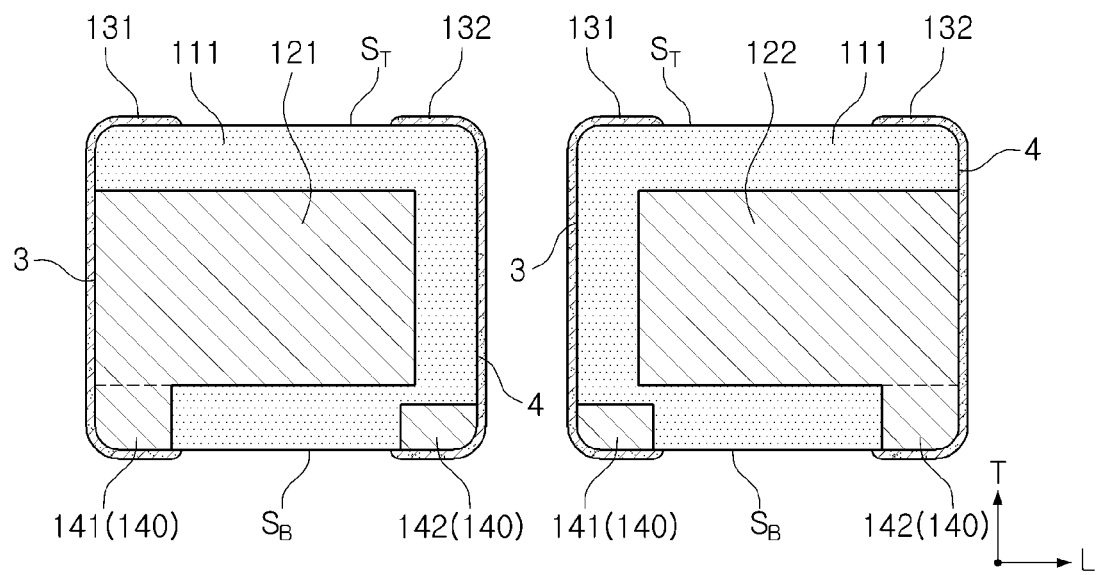

Further, referring to FIGS. 9A and 9B illustrating another modified example of the dummy electrode patterns, the first dummy electrode pattern 141 may be connected to the first internal electrode 121 and spaced apart from the second internal electrode 122, and the second dummy electrode pattern 142 may be connected to the second internal electrode 122 and spaced apart from the first internal electrode 121. In this modified example, the first and second dummy electrode patterns 141 and 142 may be disposed on one dielectric layer to be spaced apart from each other in the length direction.

The dummy electrode patterns may be differently configured as described in the above modified examples, but are not limited thereto. The modified examples of the dummy electrode patterns may be combined with each other or changed.

Figure 10:
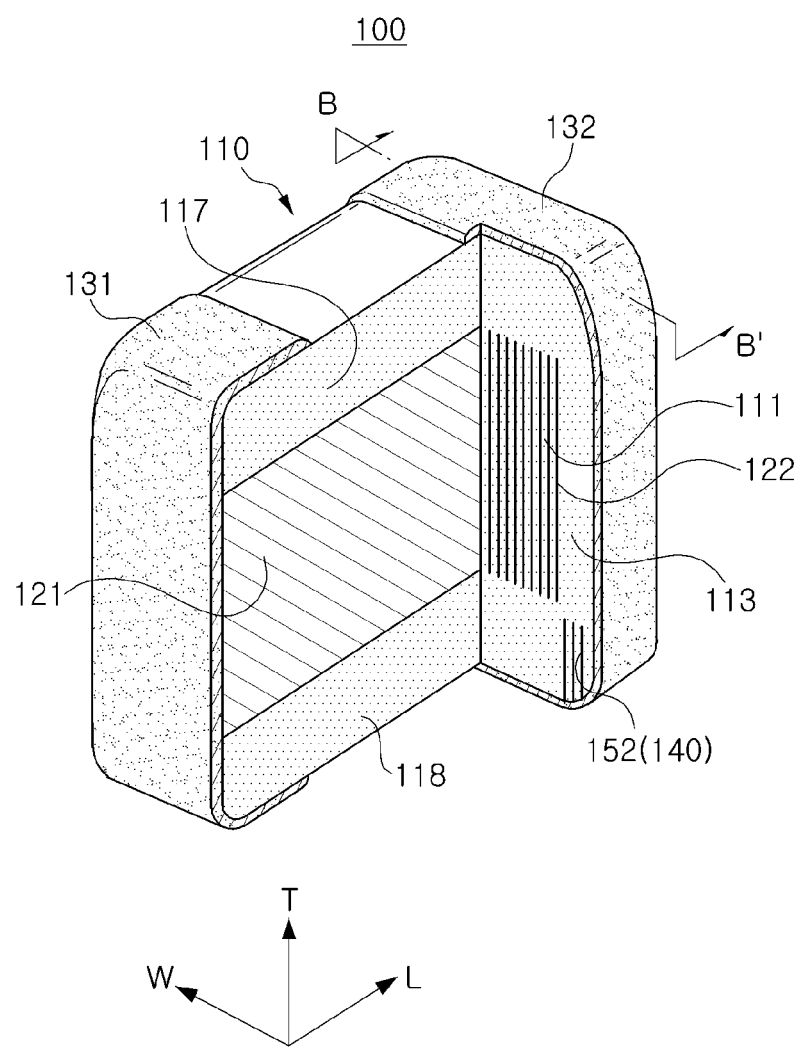
FIG. 10 is a perspective view illustrating a multilayer ceramic electronic component according to a second exemplary embodiment of the present disclosure.
Figure 11A:
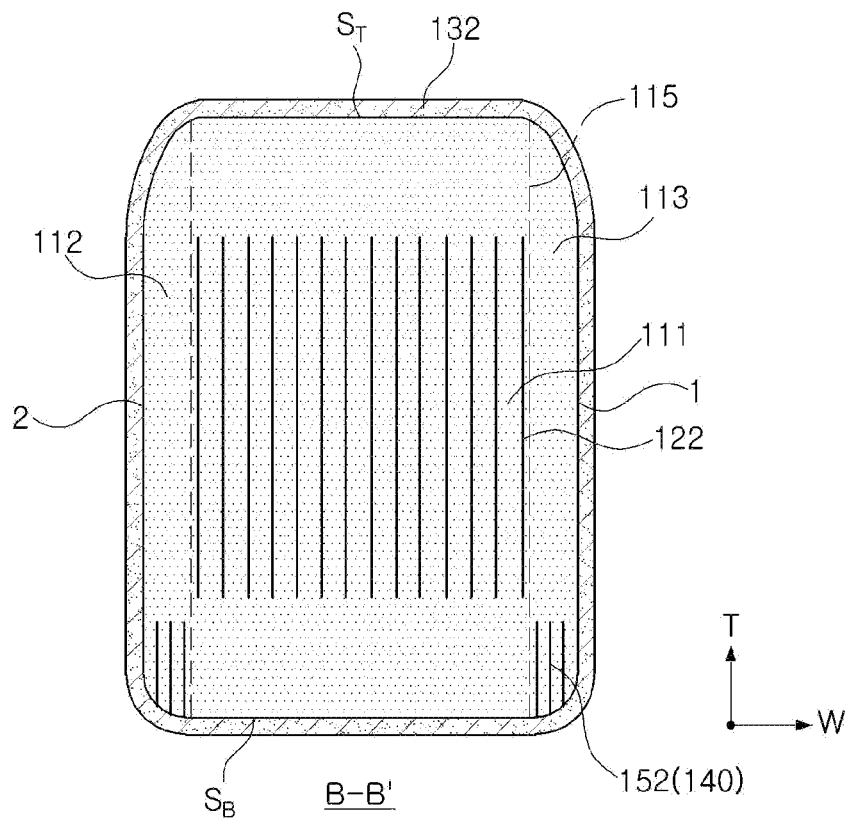
FIG. 11A is a cross-sectional view taken along line B-B' of FIG. 10.

FIG. 10 is a perspective view illustrating a multilayer ceramic electronic component 100 according to a second exemplary embodiment of the present disclosure; and FIG. 11A is a cross-sectional view taken along line B-B' of FIG. 10.

Among descriptions of the multilayer ceramic electronic component according to the second exemplary embodiment, descriptions overlapped with those of the multilayer ceramic electronic component according to the first exemplary embodiment of the present disclosure will be omitted, and only differences thereto will be described hereinafter.

A ceramic body of the multilayer ceramic electronic component according to the second exemplary embodiment of the present disclosure may include a dummy electrode pattern part 140 disposed in a lower portion thereof in a thickness direction. According to the present exemplary embodiment, the dummy electrode pattern part 140 may include third and fourth dummy electrode patterns 151 and 152 disposed in cover parts 112 and 113.

The third and fourth dummy electrode patterns 151 and 152 may be disposed in lower portions of cover parts 112 and 113 of the ceramic body in the thickness direction and restrain a lower margin portion 118 from shrinking in a width direction at the time of sintering the ceramic body to increase a volume of the lower margin portion, similarly to the above-mentioned dummy electrode patterns disposed in the active part.

The third and fourth dummy electrode patterns 151 and 152 may be formed of the same material as that of internal electrodes 121 and 122, but are not limited thereto.

The lower portions of the cover parts 112 and 113 in the thickness direction may refer to regions below central portions of the cover parts in the thickness direction.

In order to efficiently move the center of gravity of the ceramic body toward a lower surface $S_B$ of the ceramic body, the third and fourth dummy electrode patterns may be disposed within a thickness range of about 35% from the lower surface $S_B$ of the ceramic body with respect to the entire thickness of the ceramic body, but are not limited thereto.

Figure 11B:
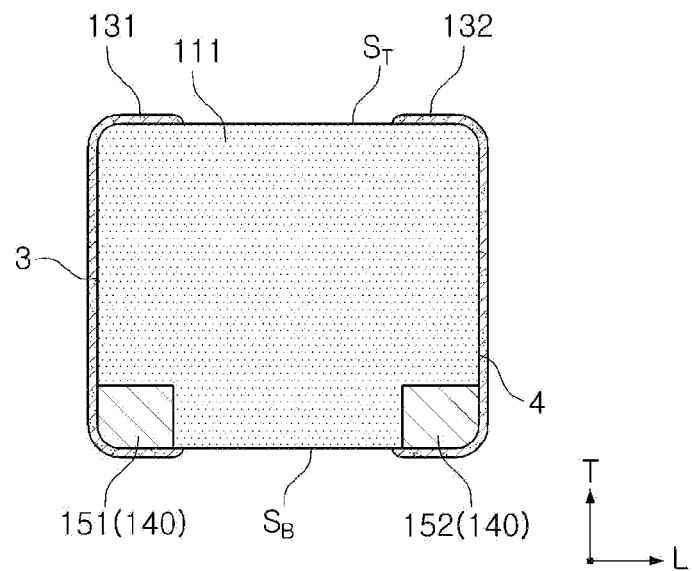
FIG. 11B is a cross-sectional view of the multilayer ceramic electronic component according to the second exemplary embodiment of the present disclosure in a length-thickness direction.

FIG. 11B is a cross-sectional view of the multilayer ceramic electronic component according to the present exemplary embodiment in a length-thickness direction, illustrating dielectric layers 111 configuring the cover part and the third and fourth dummy electrode patterns 151 and 152 disposed on the dielectric layers 111.

The third dummy electrode pattern 151 may be disposed in a region between a central portion of the ceramic body in a length direction and a first end surface 3 of the ceramic body and the fourth dummy electrode pattern 152 may be disposed in a region between the central portion of the ceramic body in the length direction and a second end surface 4 of the ceramic body.

An end portion of the third dummy electrode pattern 151 may be exposed to the first end surface 3, and an end portion of the fourth dummy electrode pattern 152 may be exposed to the second end surface 4.

In the case in which the third and fourth dummy electrode patterns 151 and 152 are disposed on the same dielectric layer, the third and fourth dummy electrode patterns may be spaced apart from each other in the length direction.

In the case in which the end portions of the third and fourth dummy electrode patterns 151 and 152 are exposed to the first and second end surfaces, respectively, an adhesion strength of external electrodes may be further improved.

The end portions of the third and fourth dummy electrode patterns 151 and 152 may be exposed to the lower surface $S_B$ of the ceramic body as shown in FIG. 11B. In this case, first and second external electrodes 131 and 132 may be extended to the lower surface of the ceramic body to cover the exposed portions of the third and fourth dummy electrode patterns, respectively.

The external electrodes may be extended to an upper surface $S_T$ of the ceramic body at a length substantially similar to that of portions of the first and second external electrodes 131 and 132 extended to the lower surface $S_B$ of the ceramic body.

Figure 12:
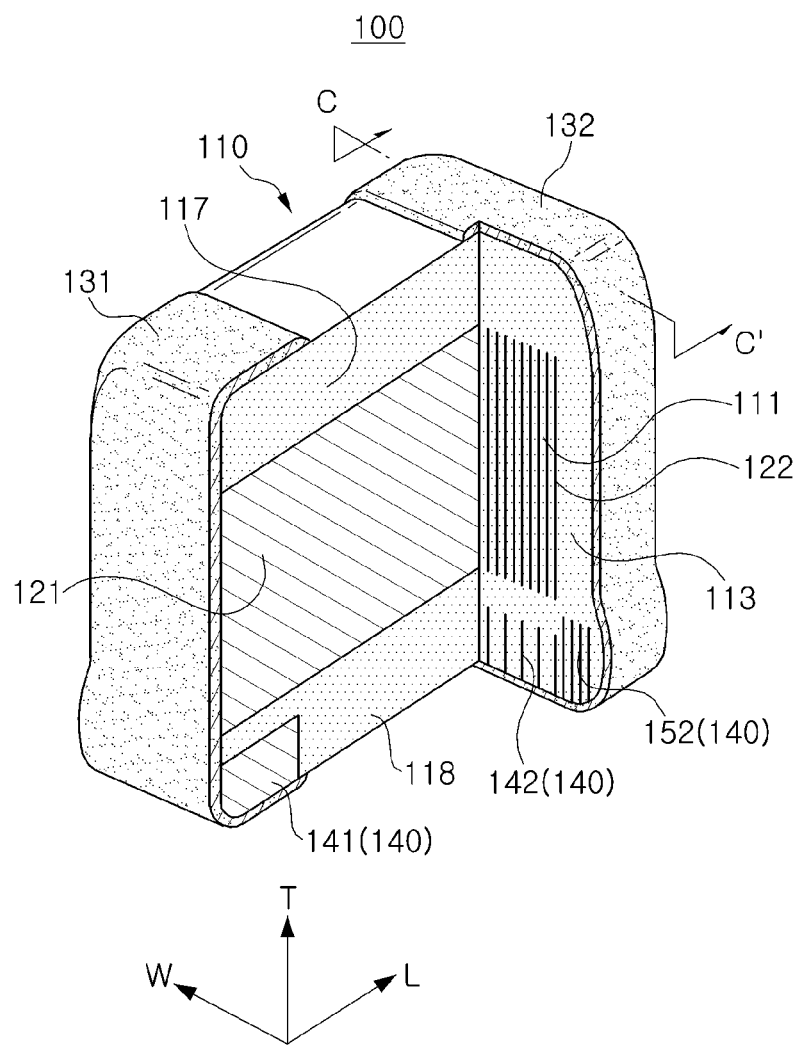
FIG. 12 is a perspective view illustrating a multilayer ceramic electronic component according to a third exemplary embodiment of the present disclosure.
Figure 13:
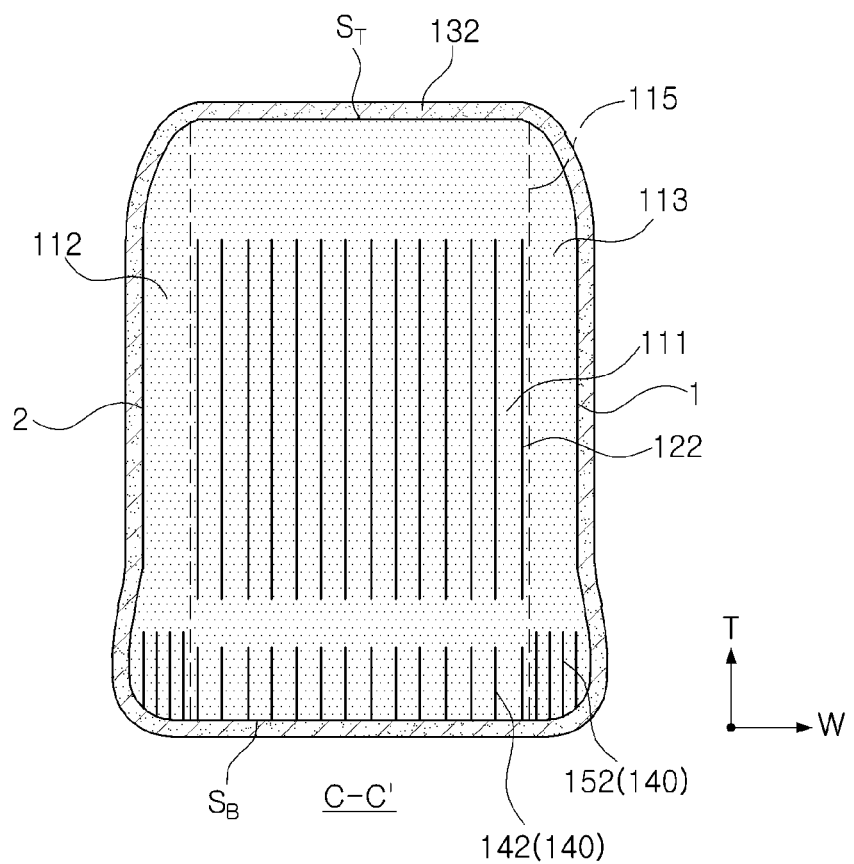
FIG. 13 is a cross-sectional view taken along line C-C' of FIG. 12.

FIG. 12 is a perspective view illustrating a multilayer ceramic electronic component according to a third exemplary embodiment of the present disclosure, and FIG. 13 is a cross-sectional view taken along line C-C' of FIG. 12.

Among descriptions of the multilayer ceramic electronic component according to the third exemplary embodiment, descriptions overlapped with those of the multilayer ceramic electronic component according to the first or second exemplary embodiment of the present disclosure will be omitted, and only differences thereto will be described hereinafter.

A ceramic body 110 of the multilayer ceramic electronic component according to the third exemplary embodiment of the present disclosure may include a dummy electrode pattern part 140 disposed in a lower portion thereof in a thickness direction. According to the present exemplary embodiment, the dummy electrode pattern part may include first and second dummy electrode patterns 141 and 142 disposed in an active part and third and fourth dummy electrode patterns 151 and 152 disposed in cover parts.

Since details of the first and second dummy electrode patterns 141 and 142 and the third and fourth dummy electrode patterns 151 and 152 are identical to those described in the first and second exemplary embodiments, a detailed description thereof will be omitted.

In the case in which all of the first and second dummy electrode patterns 141 and 142 disposed in the active part and the third and fourth dummy electrode patterns 151 and 152 disposed in the cover parts are formed in the lower portion of the ceramic body as in the present exemplary embodiment, a width of the lower margin portion 118 of the ceramic body in which the dummy electrode patterns 141, 142, 151, and 152 are disposed may be greater than that of the central portion of the ceramic body in the thickness direction.

According to the present exemplary embodiment, since all of the dummy electrode patterns are formed in the lower portion of the ceramic body, a volume of the lower margin portion of the ceramic body may be further increased as compared to the related art, thereby securing stability at the time of mounting the multilayer ceramic electronic component on a board and achieving an effect of preventing a chip toppling phenomenon.

As described above, in the multilayer ceramic electronic component according to exemplary embodiments of the present disclosure, the volume increasing part disposed in the lower portion of the ceramic body may suppress a decrease in the width of the lower portion of the ceramic body and allow the volume of the lower margin portion of the ceramic body to be greater than that of the upper margin portion of the ceramic body, whereby mounting stability may be secured at the time of being mounted on the board.

For example, in the case in which a ceramic body does not include the volume increasing part, lower and upper margin portions of the ceramic body in a thickness direction in which no internal electrodes are disposed may be shrunk further in a width direction during sintering as compared to a central portion of the ceramic body in the thickness direction in which the internal electrodes are disposed, such that the lower and upper margin portions of the ceramic body in the thickness direction may be narrower than the central portion thereof in the thickness direction. That is, the width of the ceramic body may be decreased in regions adjacent to upper and lower surfaces of the ceramic body, and thus, stability at the time of mounting the ceramic body on the board may not be secured due to a decrease in area of the upper or lower surface of the ceramic body that will serve as a mounting surface.

Particularly, in the case of a multilayer ceramic electronic component in which a thickness of a ceramic body is larger than a width thereof as in exemplary embodiments of the present disclosure, a mounting defect may be more severe due to shrinkage of upper and lower margin portions.

However, according to the exemplary embodiment of the present disclosure, at the time of sintering the ceramic body, an excessive shrinkage phenomenon of the lower margin portion may be restrained by the volume increasing part disposed in the lower portion of the ceramic body, thereby suppressing the decrease in the width of the lower portion of the ceramic body, whereby a defect occurring at the time of mounting the multilayer ceramic electronic component on a board may be decreased.

According to an exemplary embodiment of the present disclosure, the volume increasing part may only be disposed at one portion of the ceramic body 110 in the thickness direction, which may be defined as the lower portion of the ceramic body. In addition, among two surfaces of the ceramic body opposing each other in the thickness direction, a surface of the ceramic body adjacent to the volume increasing part may be defined as the lower surface $S_B$, and a surface thereof opposing the lower surface $S_B$ in the thickness direction may be defined as the upper surface $S_T$. One portion and the other portion of the ceramic body 110 in the thickness direction or the upper and lower portions of the ceramic body 110 may be distinguished based on the central portion of the ceramic body in the thickness direction.

In the case in which the volume increasing part is only disposed in the lower portion of the ceramic body 110 as in the exemplary embodiment of the present disclosure, the center of gravity O of the ceramic body 110 may be disposed below the central portion of the ceramic body in the thickness direction, whereby at the time of mounting the multilayer ceramic electronic component on the board, the chip toppling phenomenon and the mounting defect may be prevented.

In addition, since there is no internal electrode and no volume increasing part in the upper margin portion 117 of the ceramic body, shrinkage of the ceramic body in the width direction at the time of sintering may be further increased as compared to the central portion of the ceramic body in the thickness direction, and thus, the width of the upper margin portion 117 of the ceramic body may be relatively narrower as compared to that of the central portion or the lower margin portion 118 of the ceramic body in the thickness direction.

In the present disclosure, the volume or width of the lower margin portion may be measured to include the volume increasing part disposed in the lower margin portion.

According to the exemplary embodiment of the present disclosure, since the upper margin portion 117 of the ceramic body corresponding to the intervals between the upper edges of the first and second internal electrodes and the upper surface of the ceramic body is only formed of the dielectric layers 111 without the volume increasing part, the shrinkage of the upper margin portion 117 of the ceramic body in the width direction may be relatively increased at the time of sintering, whereby the width and volume of the lower margin portion 118 of the ceramic body may be greater than those of the upper margin portion of the ceramic body.

Further, the area of the lower surface $S_B$ of the ceramic body may be wider than that of the upper surface $S_T$ of the ceramic body.

In addition, since the volume increasing part is disposed in the lower portion of the ceramic body 110, the length of the edge of the ceramic body 110 at which the lower surface $S_B$ of the ceramic body 110 meets the end surface 3 or 4 thereof may be longer than that of the edge thereof at which the upper surface $S_T$ of the ceramic body 110 meets the end surface 3 or 4 thereof.

The ceramic body 110 in the exemplary embodiment of the present disclosure may not have a perfect hexahedral shape due to sintering shrinkage and polishing but may have a substantially hexahedral shape. On the assumption that the shape of the ceramic body is substantially hexahedral, lengths and areas of upper and lower surfaces and edges of the hexahedron, which may be considered to be upper and lower surfaces and edges of the ceramic body 110, may be measured.

In the case in which the width and volume of the lower margin portion 118 of the ceramic body are greater than those of the upper margin portion 117 of the ceramic body as described above or in the case in which the area of the lower surface $S_B$ of the ceramic body is larger than that of the upper surface $S_T$ of the ceramic body, the chip toppling phenomenon and the mounting defect occurring at the time of mounting the multilayer ceramic electronic component on the board may be decreased.

Board for Mounting Multilayer Ceramic Electronic Component

Figure 14:
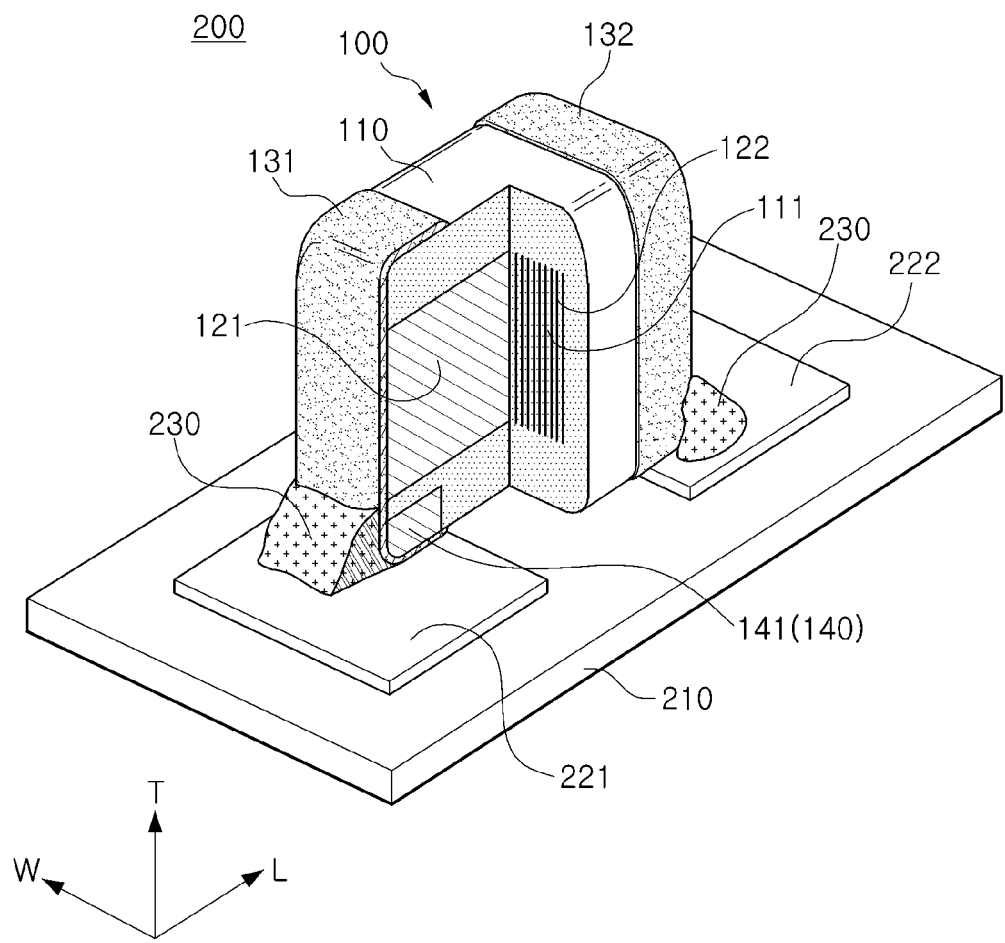
FIGS. 14 through 16 are perspective views illustrating a board on which a multilayer ceramic electronic component is mounted according to a fourth exemplary embodiment of the present disclosure.
Figure 15:
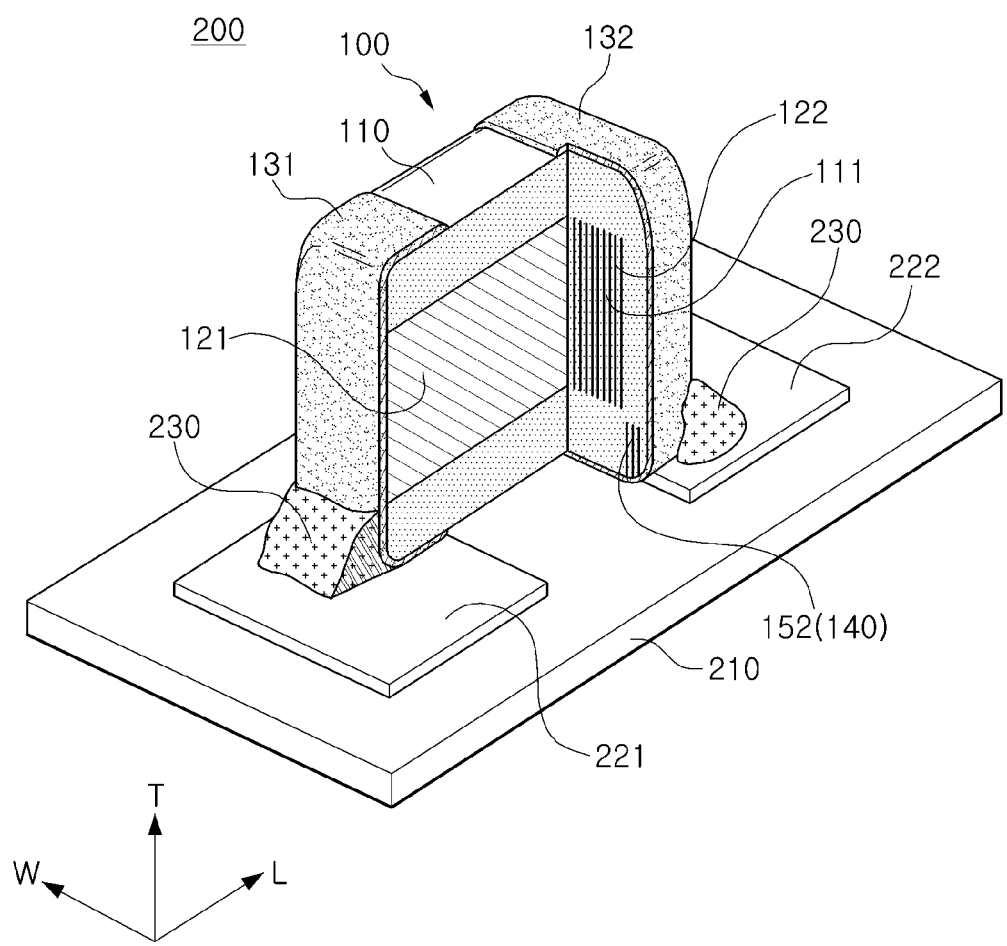
Figure 16:
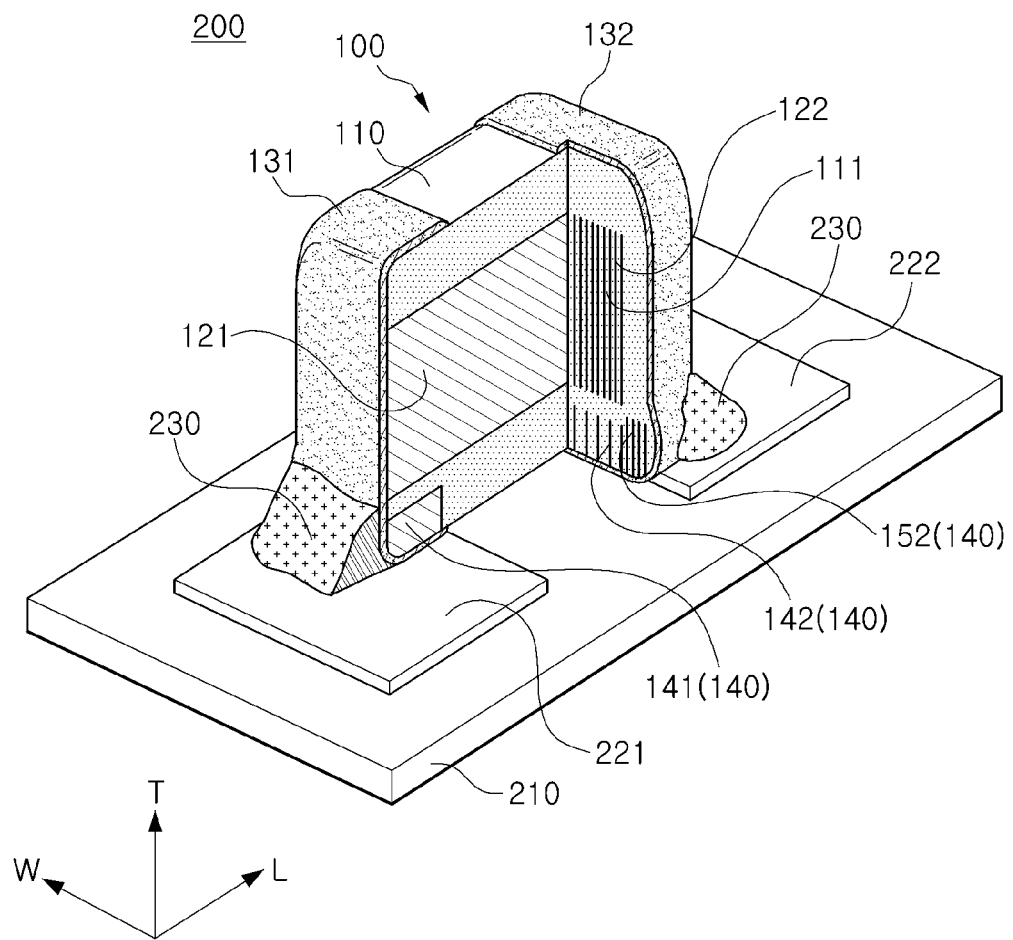

FIGS. 14 through 16 are perspective views illustrating a board 200 on which a multilayer ceramic electronic component is mounted according to a fourth exemplary embodiment of the present disclosure.

FIG. 14 illustrates a board on which the multilayer ceramic electronic component according to the first exemplary embodiment of the present disclosure is mounted; FIG. 15 illustrates a board on which the multilayer ceramic electronic component according to the second exemplary embodiment of the present disclosure is mounted; and FIG. 16 illustrates a board on which the multilayer ceramic electronic component according to the third exemplary embodiment of the present disclosure is mounted.

Referring to FIG. 14, the board 200 for mounting the multilayer ceramic electronic component according to this exemplary embodiment of the present disclosure may include a printed circuit board 210 on which the multilayer ceramic electronic component 100 is mounted and first and second electrode pads 221 and 222 formed on the printed circuit board 210 to be spaced apart from each other.

In this case, the multilayer ceramic electronic component 100 may be electrically connected to the printed circuit board 210 by solders 230 in a state in which the first and second external electrodes 131 and 132 are positioned to contact the first and second electrode pads 221 and 222, respectively.

That is, according to the present exemplary embodiment, there is provided the board 200 for mounting a multilayer ceramic electronic component, wherein the multilayer ceramic electronic component includes a ceramic body 110 including a plurality of dielectric layers 111, having upper and lower surfaces $S_T$ and $S_B$ opposing each other in a thickness direction, first and second side surfaces 1 and 2 opposing each other in a width direction, and first and second end surfaces 3 and 4 opposing each other in a length direction, and having a thickness greater than a width. First and second internal electrodes 121 and 122 are stacked with at least one of the dielectric layers interposed therebetween within the ceramic body 110 in the width direction. A volume increasing part is disposed in a lower portion of the ceramic body 110 in the thickness direction to allow a lower margin portion of the ceramic body to have a volume greater than that of an upper margin portion thereof, and when multilayer ceramic electronic component is mounted on the printed circuit board 210, the lower surface $S_B$ of the ceramic body is adjacently disposed to face the printed circuit board 210.

The multilayer ceramic electronic component may include first and second external electrodes formed on external surfaces of the ceramic body 110 to thereby be connected to the first and second internal electrodes, respectively.

The ceramic body 110 may include an active part formed by alternately stacking the first and second internal electrodes 121 and 122 and the dielectric layers 111 and a cover part disposed in at least one side portion of the ceramic body outside the active part in the width direction.

The volume increasing part may be formed of a dummy electrode pattern part 140 disposed on the dielectric layers and stacked within the ceramic body in the width direction.

The volume increasing part may include first and second dummy electrode patterns 141 and 142 disposed below the internal electrodes 121 and 122 in the active part in the thickness direction as shown in FIG. 14, or third and fourth dummy electrode patterns 151 and 152 disposed in lower portions of the cover parts in the thickness direction as shown in FIG. 15.

Alternatively, the volume increasing part may include all of the first and second dummy electrode patterns 141 and 142 disposed in the active part and the third and fourth dummy electrode patterns 151 and 152 disposed in the cover parts as shown in FIG. 16.

Descriptions of features of the multilayer ceramic electronic component mounted on the board, which are overlapped with those of the above-mentioned multilayer ceramic electronic component, will be omitted.

EXPERIMENTAL EXAMPLES

The following Table 1 illustrates results obtained by measuring frequencies of a pick-up defect and a mounting defect when multilayer ceramic electronic components of Comparative Examples and Inventive Examples are mounted on boards, in order to see if the frequencies of the defects are decreased since the multilayer ceramic electronic components according to Inventive Examples include a volume increasing part.

In the present Experimental Examples, a case in which a dummy electrode pattern part was only formed in a lower portion of an active part of a ceramic body in a thickness direction was set as Experimental Example 1; a case in which a dummy electrode pattern part was only formed in a lower portion of a cover part of a ceramic body in a thickness direction was set as Experimental Example 2; and a case in which a dummy electrode pattern part was formed in lower portions of active and cover parts of a ceramic body in a thickness direction was set as Experimental Example 3.

Further, in the present Experimental Examples, a case in which no dummy electrode pattern part was formed in the ceramic body was set as Comparative Example 1; a case in which a dummy electrode pattern part was formed in upper and lower portions of an active part of a ceramic body in a thickness direction was set as Comparative Example 2; a case in which a dummy electrode pattern part was formed in upper and lower portions of a cover part of a ceramic body in a thickness direction was set as Comparative Example 3; and a case in which a dummy electrode pattern part was formed in upper and lower portions of active and cover parts of a ceramic body in a thickness direction was set as Comparative Example 4.

The multilayer ceramic electronic components of Comparative Examples and Inventive Examples were manufactured as follows.

First, a slurry containing a barium titanate ($BaTiO_3$) based powder was applied to carrier films and dried to prepare a plurality of ceramic green sheets having a thickness of about 1.1 μm, thereby forming dielectric layers.

Next, a conductive paste for internal electrodes containing a nickel powder was prepared. A multilayer body was manufactured by applying the conductive paste for internal electrodes to the green sheets at a thickness of about 0.8 μm using a screen printing method to form internal electrode patterns, stacking 220 green sheets on which the internal electrode patterns were formed, and additionally stacking 16 green sheets on which no internal electrode patterns were formed in order to form a cover part. The above-described multilayer body was prepared in plural.

In the cases of Inventive Examples 1 to 3 and Comparative Examples 2 to 4, the dummy electrode pattern part was formed by applying the conductive paste for internal electrodes on the green sheets using the screen printing method during a process of forming the internal electrode patterns. In the Experimental Examples, a thickness of the dummy electrode pattern part formed in the active part was about 0.8 μm, and a thickness of the dummy electrode pattern part formed in the cover part was about 2 μm.

The dummy electrode pattern part disposed in the active part was formed on the green sheets on which the internal electrode patterns were formed, and the dummy electrode pattern part disposed in the cover part was formed on the green sheets on which no internal electrode patterns were formed.

Then, isostatic pressing was performed on each multilayer body at about 85° C. and at a pressure of about 1000 kgf/cm². The multilayer body subjected to the isostatic pressing was cut so that ends of internal electrode patterns were alternately exposed through end surfaces of the cut multilayer body. Then, the multilayer body was subjected to a de-binding process by being maintained at about 230° C. for about 60 hours under an air atmosphere.

Thereafter, a ceramic body was formed by sintering the multilayer body at about 1200° C. under a reduction atmosphere having an oxygen partial pressure of about $10^{-11}$ atm to $10^{-10}$ atm lower than Ni—NiO equilibrium oxygen partial pressure in order to prevent internal electrodes from being oxidized and then polishing the sintered body. After sintering, the ceramic body had a size of about 0.6 mm×0.3 mm×0.7 mm (length×width×thickness (L×W×T)).

The length of the ceramic body was measured based on the center of the body in a width-thickness direction, the width thereof was measured based on the center of the body in a length-thickness direction, and the thickness thereof was measured based on the center of the body in a width-length direction.

Then, external electrodes were formed on both end surfaces of the ceramic body to be connected to the internal electrodes.

The external electrodes were formed by sintering a paste containing a copper powder and glass.

According to Comparative Examples and Inventive Examples, the dummy electrode pattern part was disposed on one end portion and the other end portion of the ceramic body in the length direction on the dielectric layers on which the first and second internal electrodes were printed.

That is, in the multilayer ceramic electronic component of Inventive Example 1, the volume increasing part was formed as illustrated in FIG. 8B; in the multilayer ceramic electronic component of Inventive Example 2, the volume increasing part was formed as illustrated in FIGS. 11A and 11B; and in the multilayer ceramic electronic component of Inventive Example 3, the volume increasing part was formed as illustrated in FIGS. 12 and 13.

In Comparative Examples 2 to 4, the volume increasing parts were formed similarly to those in Inventive Examples 1 to 3, respectively, except that the volume increasing parts were formed in both of the upper and lower portions of the ceramic body in the thickness direction.

The dummy electrode pattern part disposed in the cover part was formed to be exposed to a lower surface (and an upper surface in the cases of Comparative Examples) of the ceramic body and have an approximate thickness equal to about 20% to 25% of the entire thickness of the ceramic body in the thickness direction.

In Comparative Examples and Inventive Examples, upper and lower margin portions were formed to have an approximate thickness equal to about 10% of the entire thickness of the ceramic body.

The dummy electrode pattern part disposed in the active part was formed to have an approximate length equal to about 12% of the entire length of the ceramic body, and the dummy electrode pattern part disposed in the cover part was formed to have an approximate length equal to about 10% of the entire length of the ceramic body.

The dummy electrode pattern part disposed in the active part was formed to be exposed to the lower surface (and the upper surface in the cases of Comparative Examples) of the ceramic body and to be spaced apart from the internal electrodes by an interval of about 25 μm in the thickness direction.

All pick-up defects and mounting defects of Table 1 were tested under severe conditions.

In detail, the occurrence of pick-up defects was tested by measuring the number of multilayer ceramic electronic components not appropriately picked up when the multilayer ceramic electronic component was picked up since the ceramic body leaned by about 0.1 mm in the width direction during a process of mounting the ceramic body by using the lower surface of the ceramic body in the thickness direction as a mounting surface, and the occurrence of mounting defects was tested by measuring the number of multilayer ceramic electronic components toppled at the time of mounting the picked-up multilayer ceramic electronic components on a board.

TABLE 1

| Sample | Volume Increasing Part Included | Pick-up Defect | Mounting Defect |
|---|---|---|---|
| Comparative Example 1 | No | 2.17% | 0.55% |
| Comparative Example 2 | Dummy Electrode Pattern Part Disposed in Upper and Lower Portions of Active Part | 0.10% | 0.45% |
| Comparative Example 3 | Dummy Electrode Pattern Part Disposed in Upper and Lower Portions of Cover Part | 0.25% | 0.48% |

TABLE 1-continued

| Sample | Volume Increasing Part Included | Pick-up Defect | Mounting Defect |
|---|---|---|---|
| Comparative Example 4 | Dummy Electrode Pattern Part Disposed in Upper and Lower Portions of Active and Cover Parts | 0.10% | 0.47% |
| Inventive Example 1 | Dummy Electrode Pattern Part Disposed in Lower portion of Active Part | 0.01% | 0.00% |
| Inventive Example 2 | Dummy Electrode Pattern Part Disposed in Lower Portion of Cover Part | 0.01% | 0.00% |
| Inventive Example 3 | Dummy Electrode Pattern Part Disposed in Lower Portions of Active and Cover Parts | 0.00% | 0.00% |

As shown in Table 1, it may be seen that in Comparative Example 1 in which the volume increasing part was not disposed in the upper and lower portions of the ceramic body in the thickness direction, the occurrence frequencies of the pick-up defects and the mounting defects were high.

In addition, it may be seen that in Comparative Examples 2 to 4 in which the volume increasing part was disposed in both of the upper and lower portions of the ceramic body in the thickness direction unlike Inventive Examples 1 to 3, the occurrence frequencies of the pick-up defects and the mounting defects were decreased as compared to Comparative Example 1, but were still high as compared to Inventive Examples 1 to 3.

It may be seen that in Inventive Examples 1 to 3, the occurrence frequencies of the pick-up defects and the mounting defects were significantly decreased as compared to Comparative Examples 2 to 4.

As set forth above, according to exemplary embodiments of the present disclosure, a multilayer ceramic electronic component capable of decreasing a chip toppling phenomenon at the time of being mounted on a board to achieve excellent mounting stability, and a board for mounting the same may be provided.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component, comprising:
    a ceramic body having a thickness greater than a width, the ceramic body including: a plurality of dielectric layers, and having upper and lower surfaces opposing each other in a thickness direction, first and second side surfaces opposing each other in a width direction, and first and second end surfaces opposing each other in a length direction;
    first and second internal electrodes stacked with at least one of the dielectric layers interposed therebetween within the ceramic body in the width direction; and
    a volume increasing part disposed in a lower portion of the ceramic body in the thickness direction to allow a volume of a lower margin portion of the ceramic body to be greater than that of an upper margin portion thereof.

2. The multilayer ceramic electronic component of claim 1, wherein an edge of the ceramic body at which the lower surface of the ceramic body meets the first and second end surfaces of the ceramic body is longer than an edge thereof at which the upper surface of the ceramic body meets the first and second end surfaces of the ceramic body.

3. The multilayer ceramic electronic component of claim 1, wherein the ceramic body includes:
    an active part including a capacitance formation portion in which the dielectric layers and the internal electrodes are alternately stacked in the width direction and portions of the upper and lower margin portions, and a cover part on both sides of the active part in the width direction, and
    the volume increasing part includes a dummy electrode pattern part disposed downwardly of the first and second internal electrodes within the active part in the thickness direction.

4. The multilayer ceramic electronic component of claim 3, wherein the dummy electrode pattern part is disposed to be spaced apart from the first and second internal electrodes.

5. The multilayer ceramic electronic component of claim 3, wherein the dummy electrode pattern part is disposed to be connected to the first or second internal electrode.

6. The multilayer ceramic electronic component of claim 3, wherein the dummy electrode pattern part includes:
    a first dummy electrode pattern disposed in a region between a central portion of the ceramic body in the length direction and the first end surface of the ceramic body; and
    a second dummy electrode pattern disposed in a region between the central portion of the ceramic body in the length direction and the second end surface of the ceramic body.

7. The multilayer ceramic electronic component of claim 6, wherein the first and second dummy electrode patterns are alternately disposed with at least one of the dielectric layers interposed therebetween.

8. The multilayer ceramic electronic component of claim 6, wherein the first and second dummy electrode patterns are disposed on the same dielectric layer to be spaced apart from each other, and are stacked in the width direction.

9. The multilayer ceramic electronic component of claim 6, wherein the first dummy electrode pattern is exposed to the first end surface of the ceramic body, and
    the second dummy electrode pattern is exposed to the second end surface of the ceramic body.

10. The multilayer ceramic electronic component of claim 6, wherein a number of first dummy electrode patterns is equal to a sum of a number of first internal electrodes and a number of second internal electrodes, and
    a number of second dummy electrode patterns is equal to a sum of a number of first internal electrodes and a number of second internal electrodes.

11. The multilayer ceramic electronic component of claim 6, wherein a number of first dummy electrode patterns is equal to a number of first internal electrodes, and
    a number of second dummy electrode patterns is equal to a number of second internal electrodes.

12. The multilayer ceramic electronic component of claim 6, wherein the first dummy electrode pattern is disposed on the dielectric layer on which the first internal electrode is disposed, and
    the second dummy electrode pattern is disposed on the dielectric layer on which the second internal electrode is disposed.

13. The multilayer ceramic electronic component of claim 6, wherein the first dummy electrode pattern is disposed on the dielectric layer on which the first internal electrode is disposed and the dielectric layer on which the second internal electrode is disposed, and the second dummy electrode pattern is disposed on the dielectric layer on which the first internal electrode is disposed and the dielectric layer on which the second internal electrode is disposed.

14. The multilayer ceramic electronic component of claim 6, wherein the first and second dummy electrode patterns are exposed to the lower surface of the ceramic body.

15. The multilayer ceramic electronic component of claim 1, wherein:
the ceramic body includes an active part including a capacitance formation portion in which the dielectric layers and the internal electrodes are alternately stacked in the width direction and portions of the upper and lower margin portions in which the dielectric layers are stacked in the width direction, and a cover part in which the dielectric layers are stacked on both sides of the active part in the width direction, and
the volume increasing part includes a dummy electrode pattern part disposed in a lower portion of the cover part in the thickness direction.

16. The multilayer ceramic electronic component of claim 15, wherein the dummy electrode pattern part includes:
a third dummy electrode pattern disposed in a region between a central portion of the ceramic body in the length direction and the first end surface of the ceramic body; and
a fourth dummy electrode pattern disposed in a region between the central portion of the ceramic body in the length direction and the second end surface of the ceramic body.

17. The multilayer ceramic electronic component of claim 1, wherein the first and second internal electrodes are disposed to be substantially perpendicular with respect to a mounting surface of the ceramic body at the time of being mounted on a board.

18. A multilayer ceramic electronic component, comprising:
a ceramic body having a thickness greater than a width and including an active part including a capacitance formation portion in which dielectric layers and internal electrodes are alternately stacked in a width direction and portions of upper and lower margin portions in which the dielectric layers are stacked in the width direction, and a cover part in which the dielectric layers are stacked on both sides of the active part in the width direction;
first and second external electrodes formed on both end surfaces of the ceramic body opposing each other in a length direction, respectively;
a dummy electrode pattern part to allow a center of gravity of the ceramic body to be positioned downwardly of a center of the ceramic body in a thickness direction; and
a volume increasing part disposed in a lower portion of the ceramic body in the thickness direction to allow a volume of the lower margin portion of the ceramic body to be greater than that of the upper margin portion thereof.

19. A multilayer ceramic electronic component, comprising:
a ceramic body having a thickness greater than a width and including: an active part including a capacitance formation portion in which dielectric layers and internal electrodes are alternately stacked in a width direction and portions of upper and lower margin portions in which the dielectric layers are stacked in the width direction, and a cover part in which the dielectric layers are stacked on both sides of the active part in the width direction;
a dummy electrode pattern part disposed downwardly of the internal electrodes within the active part in a thickness direction;
external electrodes electrically connected to the internal electrodes and covering both end surfaces of the ceramic body; and
a volume increasing part disposed in a lower portion of the ceramic body in the thickness direction to allow a volume of the lower margin portion of the ceramic body to be greater than that of the upper margin portion thereof.

20. The multilayer ceramic electronic component of claim 19, further comprising another dummy electrode pattern part disposed in a lower portion of the cover part in the thickness direction.

21. A multilayer ceramic electronic component, comprising:
a ceramic body having a thickness greater than a width and including: an active part including a capacitance formation portion in which dielectric layers and internal electrodes are alternately stacked in a width direction and portions of upper and lower margin portions in which the dielectric layers are stacked in the width direction, and a cover part in which the dielectric layers are stacked on both sides of the active part in the width direction;
a dummy electrode pattern part disposed in a lower portion of the cover part;
external electrodes electrically connected to the internal electrodes and covering both end surfaces of the ceramic body; and
a volume increasing part disposed in a lower portion of the ceramic body in a thickness direction to allow a volume of the lower margin portion of the ceramic body to be greater than that of the upper margin portion thereof.

22. An assembly board having a multilayer ceramic electronic component, the board comprising:
a printed circuit board on which first and second electrode pads are formed; and
the multilayer ceramic electronic component mounted on the printed circuit board,
wherein the multilayer ceramic electronic component comprises:
a ceramic body having a thickness greater than a width, the ceramic body including: a plurality of dielectric layers, and having upper and lower surfaces opposing each other in a thickness direction, first and second side surfaces opposing each other in a width direction, and first and second end surfaces opposing each other in a length direction;
first and second internal electrodes stacked with at least one of the dielectric layers interposed therebetween within the ceramic body in the width direction; and
a volume increasing part disposed in a lower portion of the ceramic body in the thickness direction to allow a volume of a lower margin portion of the ceramic body to be greater than that of an upper margin portion thereof, and
the lower surface of the ceramic body is adjacently mounted to face the printed circuit board.

23. The assembly board of claim 22, wherein the ceramic body includes: an active part including a capacitance formation portion in which the dielectric layers and the internal electrodes are alternately stacked in the width direction and portions of the upper and lower margin portions in which the dielectric layers are stacked in the width direction, and a cover part in which the dielectric layers are stacked on both sides of the active part in the width direction, and the volume increasing part includes a dummy electrode pattern part disposed downwardly of the first and second internal electrodes within the active part in the thickness direction.

24. The assembly board of claim 22, wherein the ceramic body includes: an active part including a capacitance formation portion in which the dielectric layers and the internal electrodes are alternately stacked in the width direction and portions of the upper and lower margin portions in which the dielectric layers are stacked in the width direction, and a cover part in which the dielectric layers are stacked on both sides of the active part in the width direction, and the volume increasing part includes a dummy electrode pattern part disposed in a lower portion of the cover part in the thickness direction.

25. The assembly board of claim 22, wherein the ceramic body includes: an active part including a capacitance formation portion in which the dielectric layers and the internal electrodes are alternately stacked in the width direction and portions of the upper and lower margin portions in which the dielectric layers are stacked in the width direction, and a cover part in which the dielectric layers are stacked on both sides of the active part in the width direction, and the volume increasing part includes a dummy electrode pattern part disposed downwardly of the first and second internal electrodes within the active part in the thickness direction and a dummy electrode pattern part disposed in a lower portion of the cover part in the thickness direction.

26. A multilayer ceramic electronic component for mounting on a printed circuit board, comprising:

a ceramic body including:

a plurality of dielectric layers, an upper surface and lower mounting surface opposing each other in a thickness direction, first and second side surfaces opposing each other in a width direction, and first and second end surfaces opposing each other in a length direction;

a plurality of internal electrodes stacked within the ceramic body in the width direction;

a plurality of dummy electrode patterns disposed below the internal electrodes; and a volume increasing part disposed in a lower portion of the ceramic body in the thickness direction to allow a volume of a lower margin portion of the ceramic body to be greater than that of an upper margin portion thereof, wherein:

an area of the lower mounting surface of the ceramic body is larger than that of the upper surface of the ceramic body, and a center of gravity of the ceramic body is positioned below a center of the ceramic body in the thickness direction.

27. The multilayer ceramic electronic component of claim 26, wherein the plurality of dummy electrode patterns include:

a first dummy electrode pattern disposed in a region between a central portion of the ceramic body in the length direction and the first end surface of the ceramic body; and a second dummy electrode pattern disposed in a region between the central portion of the ceramic body in the length direction and the second end surface of the ceramic body.

28. The multilayer ceramic electronic component of claim 27, wherein the first and second dummy electrode patterns are disposed on the same dielectric layer to be spaced apart from each other, and are stacked in the width direction.

29. The multilayer ceramic electronic component of claim 27, wherein:

the first dummy electrode pattern is exposed to the first end surface of the ceramic body, and the second dummy electrode pattern is exposed to the second end surface of the ceramic body.

* * * * *